(12) United States Patent
Inoue

(10) Patent No.: US 11,514,201 B2
(45) Date of Patent: Nov. 29, 2022

(54) FIGURE DISPLAY METHOD, SERVER AND RECORDING MEDIUM

(71) Applicant: CASIO COMPUTER CO., LTD., Tokyo (JP)

(72) Inventor: Takayuki Inoue, Tachikawa (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 16/876,248

(22) Filed: May 18, 2020

(65) Prior Publication Data

US 2020/0372190 A1 Nov. 26, 2020

(30) Foreign Application Priority Data

May 21, 2019 (JP) .............................. JP2019-095525

(51) Int. Cl.
| | |
|---|---|
| *G06F 3/048* | (2013.01) |
| *G06F 30/12* | (2020.01) |
| *G06F 3/04845* | (2022.01) |
| *G09G 3/20* | (2006.01) |
| *G06F 3/0482* | (2013.01) |
| *G06F 3/04817* | (2022.01) |

(52) U.S. Cl.
CPC ............ *G06F 30/12* (2020.01); *G06F 3/0482* (2013.01); *G06F 3/04817* (2013.01); *G06F 3/04845* (2013.01); *G09G 3/20* (2013.01)

(58) Field of Classification Search
None
See application file for complete search history.

(56) References Cited

U.S. PATENT DOCUMENTS

2005/0140678 A1* 6/2005 Gielis .................... G06T 17/00
345/441
2010/0292968 A1* 11/2010 Gielis .................. G06T 11/203
703/2

(Continued)

FOREIGN PATENT DOCUMENTS

| JP | H11272874 A | 10/1999 |
| JP | 2004094296 A | 3/2004 |

OTHER PUBLICATIONS

Bunryu Kamimura, Enlargement and Reduction of Triangles, GeoGebra Work-Plates, Nov. 8, 2017 (with English translation of web page). Accessed at https://www.geogebra.org/m/ZFdFHbyB#material/XCYrG7wJ.

(Continued)

*Primary Examiner* — William C Trapanese
(74) *Attorney, Agent, or Firm* — Holtz, Holtz & Volek PC

(57) ABSTRACT

Provided are a figure display method, a sever and a recording medium which make it possible to grasp comparatively with ease when seeing an area where a new figure is displayed that the new figure is created by executing what kind of mathematical processing thereon.
The figure display method includes displaying a first figure in a first area which is set on a display screen of a display device, creating a second figure by executing mathematical processing which is specified on the first figure and displaying the created second figure in the first display area, and providing a mathematical processing display area which displays information on the mathematical processing which is executed on the first figure in the first display area.

21 Claims, 12 Drawing Sheets

(56) References Cited

U.S. PATENT DOCUMENTS

2014/0317570 A1* 10/2014 Endo .................. G06F 15/0225
　　　　　　　　　　　　　　　　　　　　　　715/833
2015/0310646 A1* 10/2015 Karoji .................. G06T 11/206
　　　　　　　　　　　　　　　　　　　　　　345/440

OTHER PUBLICATIONS

Japanese Office Action (and English language translation thereof) dated May 10, 2022, issued in counterpart Japanese Application No. 2019-095525.

* cited by examiner

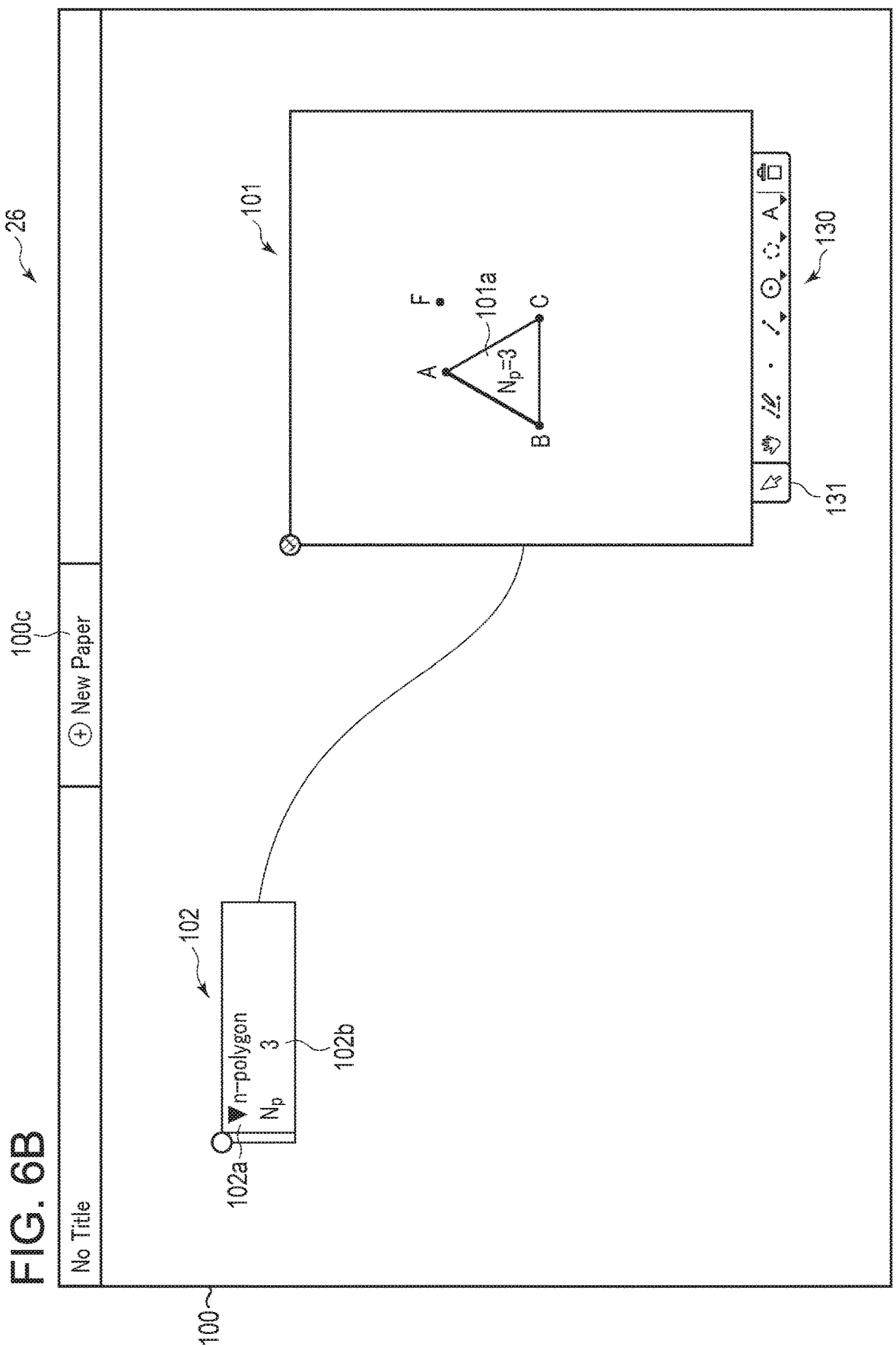

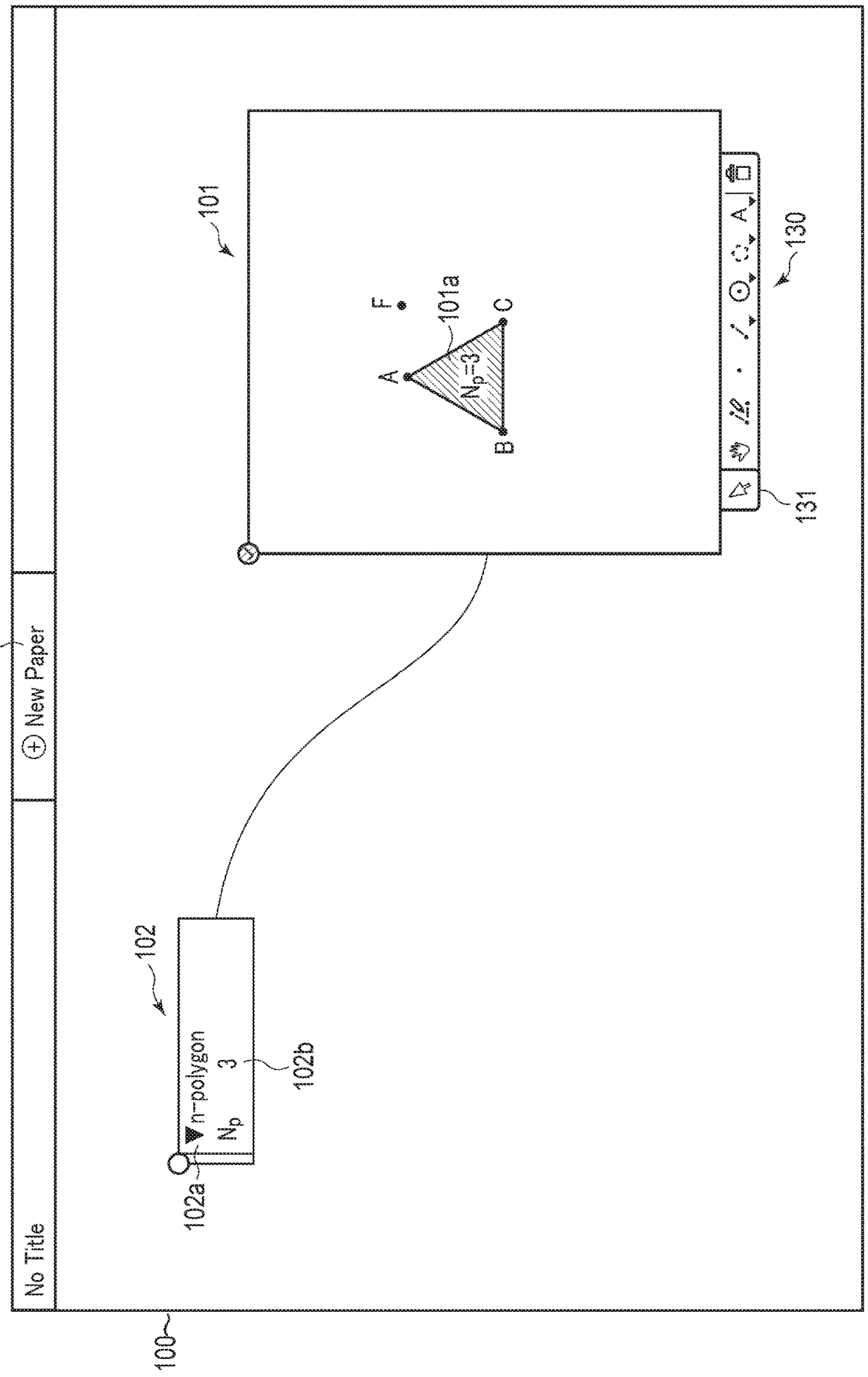

FIGURE DISPLAY METHOD, SERVER AND RECORDING MEDIUM

BACKGROUND

Field

The present disclosure relates to a figure display method, a server and a recording medium.

Related Art

Application software which is configured to display a figure which is drawn by using a computer in a drawing area (a first display area) on a screen of a display device, to generate a new figure (a second figure) which has some sort of mathematical relations with the figure (the first figure) by executing desirable mathematical processing on the figure (the first figure) and then to display the generated new figure on the screen of the display device is known.

SUMMARY

A figure display method according to a first aspect of the present invention includes displaying a first figure in a first area which is set on a display screen of a display device, creating a second figure by executing mathematical processing which is specified on the first figure and displaying the created second figure in the first display area, and providing a mathematical processing display area which displays information on the mathematical processing which is executed on the first figure in the first display area.

A server according to a second aspect of the present invention is the server which is configured to be communicable with a terminal and includes a storage which is configured to store a figure display program for making a computer of the terminal execute displaying a first figure in a first display area which is set on a display screen of a display device, creating a second figure by executing mathematical processing which is specified on the first figure and displaying the created second figure in the first display area, and providing a mathematical processing display area which displays information on the mathematical processing which is executed on the first figure in the first display area; and a communication device which transmits the figure display program which is stored in the storage to the terminal.

A nonvolatile recording medium according to a third aspect of the present invention stores therein a figure display program for making a computer execute displaying a first figure in a first display area which is set on a display screen of a display device, creating a second figure by executing mathematical processing which is specified on the first figure and displaying the created second figure in the first display area, and providing a mathematical processing display area which displays information on the mathematical processing which is executed on the first figure in the first display area.

BRIEF DESCRIPTION OF THE DRAWINGS

FIG. 6B is a diagram illustrating a display example of a case where a line segment AB is selected in the selection process.

FIG. 6C is a diagram illustrating a display example of a case where a face of an equilateral triangle ABC is selected in the selection process.

DETAILED DESCRIPTION

Figure 1:
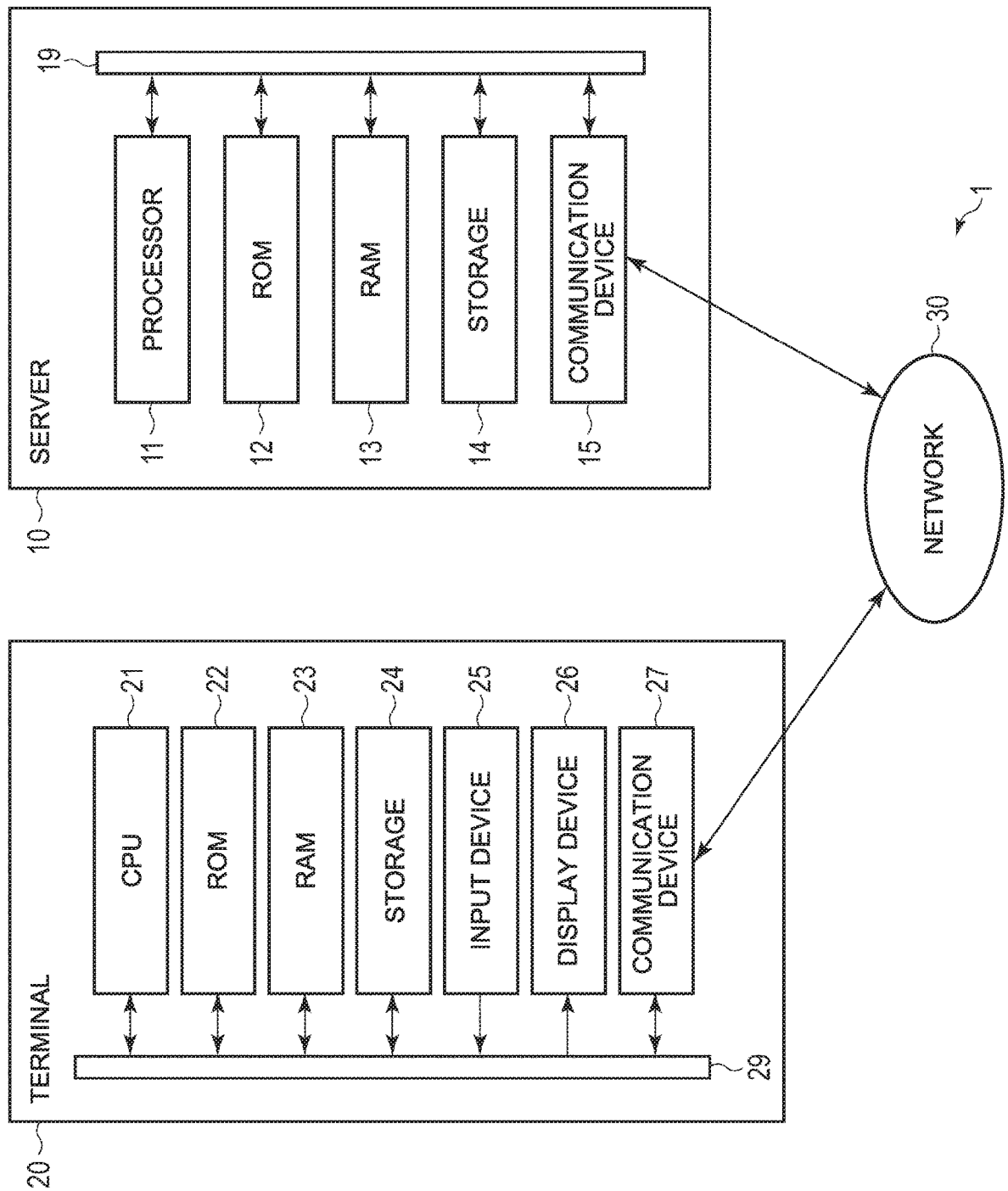
FIG. 1 is a diagram illustrating one example of a configuration of a system according to one embodiment of the present invention.

One embodiment of the present invention will be described with reference to the drawings. FIG. 1 is a diagram illustrating one example of a configuration of a system 1 according to one embodiment of the present invention. The system 1 includes a server 10 and a terminal 20. The server 10 and the terminal 20 are connected with each other to be communicable over a network 30. The network 30 is, for example, the Internet. Incidentally, although only one terminal 20 is illustrated in FIG. 1, the number of the terminals 20 is not limited to one. That is, the number of the terminals 20 may be two or more.

The server 10 has a processor 11, a ROM (Read Only Memory) 12, a RAM (Random Access Memory) 13, a storage 14, and a communication device 15. These elements are connected with one another via a system bus 19.

The processor 11 may be an integrated circuit which includes a CPU (Central Processing Unit) and so forth. The ROM 12 memorizes information which is used for operations of the processor 11 and so forth. The RAM 13 is a main memory for temporarily storing data used for the operations of the processor 11 and so forth. Various programs such as a server control program which is used in the processor 11, arithmetic operation programs used for execution of various arithmetic operations and so forth, parameters and so forth are stored in the storage 14. The processor 11 controls the operation of the server 10 in accordance with the program which is stored in the storage 14. A processor other than the CPU such as, for example, an ASIC (Application Specific Integrated Circuit), an FPGA (Field Programmable Gate Array), a GPU (Graphic Processing Unit) and so forth may be used as the processor 11. The communication device 15 includes a circuit which is used for communication with an external communication network such as the network 30 and so forth.

The terminal 20 has a CPU 21, a ROM 22, a RAM 23, a storage 24, an input device 25, a display device 26 and a communication device 27. These elements are connected with one another via a system bus 29. The terminal 20 may be electronic equipment such as a personal computer (PC), a tablet terminal, a smartphone and so forth. In addition, the terminal 20 may be a scientific electronic calculator which is equipped with a communication function and so forth.

The CPU 21 is a processor which controls various operations of the terminal 20. The ROM 22 memorizes a program used for start-up of the terminal 20 and so forth. The RAM 23 is a main memory for temporarily storing the data used for operations of the CPU 21 and so forth. Various programs such as a terminal control program and so forth, parameters and so forth which are used in the CPU 21 are stored in the storage 24. The CPU 21 executes the various programs in accordance with an input signal from the input device 25 and a signal which is received by the communication device 27 and thereby controls the operation of the terminal 20. The various programs may be downloaded from a not illustrated Web server to the storage 24 via the network 30 and the communication device 27. The communication device 27 includes a circuit which is used for communication with the external communication network such as the network 30 and so forth.

The input device 25 includes a keyboard, a mouse, a touch panel and so forth. A signal which indicates contents of a user operation is input into the CPU 21 via the system bus 29 in accordance with the user operation which is performed via the input device 25.

The display device 26 is a liquid crystal display, an organic EL (Electronic Luminescence) display and so forth. The display device 26 may be provided integrally with the terminal 20 and may be provided separately from the terminal 20. Various images are displayed on the display device 26.

In one example, a user designates an address of the server 10 using a Web browser which works in the terminal 20. In this case, a display screen for a Web application which is stored in the server 10 is displayed on the Web browser in the terminal 20. A request to the server 10 is issued in accordance with an operation which is performed on the display screen via the input device 25. This operation includes, for example, an operation of drawing a figure on the display screen. The server 10 executes a process which responds to the request and returns a result of execution of the process to the terminal 20 as a response. The terminal 20 performs figure display and so forth which respond to the user operation in accordance with the response from the server 10. In the system 1, a function which works as the Web application for figure display and so forth is realized by a program which works on the Web browser in the terminal 20 and the arithmetic operation program of the server 10 in this way.

It is possible to utilize the Web application which is configured in this way in, for example, mathematical lessons and so forth in school educational sites where advancement in ICT (Information and Communication Technology) is promoted.

Figure 2:
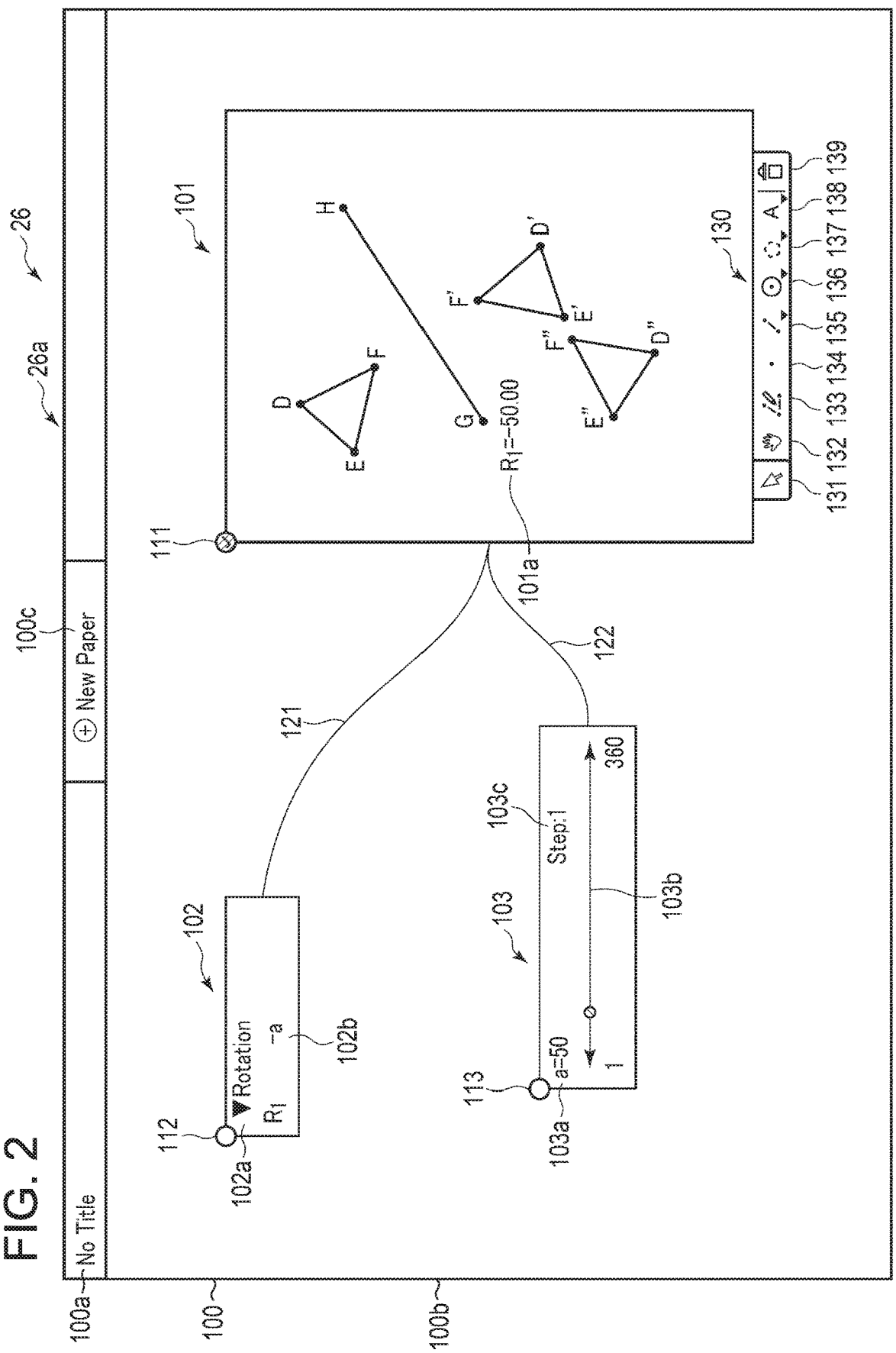
FIG. 2 is a diagram illustrating one example of a display screen which is displayed on the basis of an application which works on a Web browser in a terminal.

FIG. 2 is a diagram illustrating one example of a display screen which is displayed on the basis of an application which works on the Web browser in the terminal 20.

A screen 26a which is displayed on the display device 26 of the terminal 20 includes an upper-stage area 100a and a lower-stage area 100b. The upper-stage area 100a is displayed on the upper side of the screen 26a. The upper-stage area 100a is narrower in width than the lower-stage area 100b. A new paper creation icon 100c is displayed on the upper-stage area 100a. The lower-stage area 100b is disposed under the upper-stage area 100a on the screen 26a. In the following description, the lower-stage area 100b is also called paper 100. It is possible to display various [tags] on the paper 100. The tags are small display areas which are used to display various kinds of information on the Web application. The tags may be floating objects. Each floating object is an object (a display element) which is displayed on the screen and at least the display position of which is changeable in accordance with the user operation.

A geometrical tag (a first display area) 101, an operation tag (a mathematical processing input area) 102 and a slider tag (a mathematical processing change area) 103 are displayed on the paper 100 in FIG. 2 by way of example. An object other than a figure may be drawn on the paper 100. For example, a numerical formula, a graph, a numerical table and so forth may be drawn on the paper 100. In this case, a numerical formula tag and so forth which are different from the geometrical tag 101 may be displayed on the paper 100 simultaneously with display of the geometrical tag 101.

The geometrical tag 101 includes a display area which is used to display the figure which is drawn by receiving the user operation. In one embodiment, the [figure] includes figures which are targeted in geometry such as a point, a line (a line segment), a polygon, a circle and so forth. It is possible for the user to perform various operations such as point plotting, line drawing, circle drawing, polygon drawing and so forth in the geometrical tag 101. The geometrical tag 101 includes a display area of a plane figure. However, a solid figure may be drawn in the geometrical tag 101.

The operation tag 102 is used to display contents of the mathematical processing in a case where some sort of the mathematical processing is executed on the figure in the geometrical tag 101. For example, the operation tag 102 in FIG. 2 indicates that an operation of rotating about a point G is performed on a figure D'E'F' and a new figure D"E"F" is drawn. In this case, a letter 102a which is written as [Rotation] which indicates that rotation is performed and a value 102b of a parameter which is set in the rotation are displayed on the operation tag 102. The parameter which is set in the rotation is, for example, a rotation angle R. A number is appended to the rotation angle R. The number indicates the order in which the rotating operations are performed. For example, [$R_1$] indicates that the first rotating operation is performed in the geometrical tag 101. Here, the rotation angle may be not a numerical value but a variable. [−a] is displayed as the parameter value 102b of the operation tag 102 in FIG. 2. In the value [−a], a is a variable. For example, in a case where a clockwise direction is set as a forward rotation direction, the rotation by the value [−a] means rotation through an angle a in a counterclockwise direction. Here, information on the mathematical processing is displayed in the operation tag 102 in a state of being gathered together per kind of the mathematical processing. For example, in a case where a plurality of the rotating operations is performed, information on the rotating operations is displayed in the same operation tag 102. As will be described later, the mathematical processing may include an operation other than the rotating operation and, in a case where the operation other than the rotating operation is performed, information on the operation other than the rotating operation is displayed in another operation tag 102.

In addition, in a case where the mathematical processing such as the rotating operation and so forth is executed, a balloon (a mathematical processing display area) 101a is displayed in the geometrical tag 101. The balloon 101a is a tool chip which includes information which indicates a mathematical relation between one figure which is drawn by executing the mathematical processing and another figure which is used as a basic figure in the mathematical processing. For example, in a case where the rotating operation such as the operation which is illustrated in FIG. 2 is performed, the balloon 101a is displayed in the vicinity of the point G which is the rotation center. A current value of a parameter which is used in the rotation is displayed in the balloon 101a which is created in a case where the rotating operation is performed. [$R_1$=−50.00] is displayed in the balloon 101a in FIG. 2. In this case, the balloon 101a indicates that the rotation is performed through −50.00 degrees in the counterclockwise direction about the point G. A way of displaying the balloon 101a is made different depending on the type of the mathematical processing. Details will be described later.

The slider tag 103 includes a slider 103b which is used, in a case where a parameter used in the mathematical processing is a variable, for the purpose of setting a value of the variable. A current variable value 103a, the slider 103b and an interval value 103c are displayed on the slider tag 103. The slider 103b is configured to accept an input from the user and thereby to change a display position of a pointer. The current variable value 103a changes depending on the position of the pointer. The interval value 103c indicates an interval between values on the slider 103b. [1] is displayed as the interval value 103c in FIG. 2. In this case, the slider 103b changes the value at one-degree intervals. Incidentally, in a case where a plurality of variables is set, information on the plurality of variables may be displayed altogether on the same slider tag 103.

Check columns 111, 112 and 113 are displayed on left upper parts of the geometrical tag 101, the operation tag 102 and the slider tag 103 respectively. For example, in a case where any one of the tags is selected, a check mark is displayed on the corresponding check column. In FIG. 2, the geometrical tag 101 is selected. In this case, the check mark is displayed on the check column 111. The tag which is being selected and the tag(s) which is/are not being selected may be distinguished from each other/one another by other displaying methods and so forth, not limited to check mark display. As visual distinction methods, only an outer frame of the tag which is being selected may be displayed thicker than outer frames of the remaining tags, the outer frame of the tag which is being selected may be displayed in a state where a line type or a color thereof is made different from line types or colors of the outer frames of the remaining tags, the outer frame of the tag which is being selected may be blinkingly displayed and so forth.

In addition, the geometrical tag 101, the operation tag 102 and the slider tag 103 may be related to one another as one group. In this case, a string 121 which indicates that the geometrical tag 101 and the operation tag 102 are related to each other may be displayed between the geometrical tag 101 and the operation tag 102. In addition, a string 121 which indicates that the geometrical tag 101 and the slider tag 103 are related to each other may be displayed between the geometrical tag 101 and the slider tag 103. Further, although not illustrated in FIG. 2, also a string which indicates that the operation tag 102 and the slider tag 103 are related to each other may be displayed between the operation tag 102 and the slider tag 103.

Here, the string is used to connect together tags which belong to the same group. That is, another operation tag 102 and another slider tag 103 which are created from another geometrical tag 101 which is created separately from the above-described geometrical tag 101 are individually connected to the separately created geometrical tag 101 with strings as another group. In addition, colors and so forth of the strings may be made the same as each other/one another per group so as to allow one-glance recognition of the relation between/among the tags.

In addition, a menu icon bar 130 is illustrated under the geometrical tag 101 in FIG. 2. The menu icon bar 130 may be the floating object similarly to the tags. The menu icon bar 130 is a group of icons for use in various operations which are performed in the geometrical tag 101. Icons to be displayed on the menu icon bar 130 are not limited to the ions which are illustrated in FIG. 2. The menu icon bar 130 may not include all the icons which are illustrated in FIG. 2. In addition, the menu icon bar 130 may include icons other than the icons which are illustrated in FIG. 2.

The menu icon bar 130 includes, for example, a selection icon 131, a range change icon 132, a hand-drawing icon 133, a point drawing icon 134, a line segment drawing icon 135, a circle drawing icon 136, a polygon drawing icon 137, a text input icon 138 and a deletion icon 139. The selection icon 131 is used to accept an operation of selecting each object which is displayed in the geometrical tag 101. The range change icon 132 is used to accept an operation of changing a display range of the geometrical tag 101. The hand-drawing icon 133 is used to accept an operation that the user freely draws the figure concerned on the geometrical tag 101. The point drawing icon 134 is used to accept an operation of plotting the point concerned on the geometrical tag 101. The line segment drawing icon 135 is used to accept an operation of drawing the line segment concerned which connects together two points which are plotted on the geometrical tag 101. The circle drawing icon 136 is used to accept an operation of drawing the circle concerned about one point which is plotted on the geometrical tag 101. The polygon drawing icon 137 is used to accept an operation of drawing the polygon concerned by connecting together the three or more points which are plotted on the geometrical tag 101. The text input icon 138 is used to accept a text inputting operation which is performed by the user. The deletion icon 139 is used to accept an operation of deleting the figure which is drawn on the geometrical tag 101.

In one embodiment, the system 1 makes it possible to create the various tags and draw the target figure, starting from the paper 100 which is in a blank state. In the following, a flow of a series of the mathematical processing in the system 1 will be described.

Figure 3:
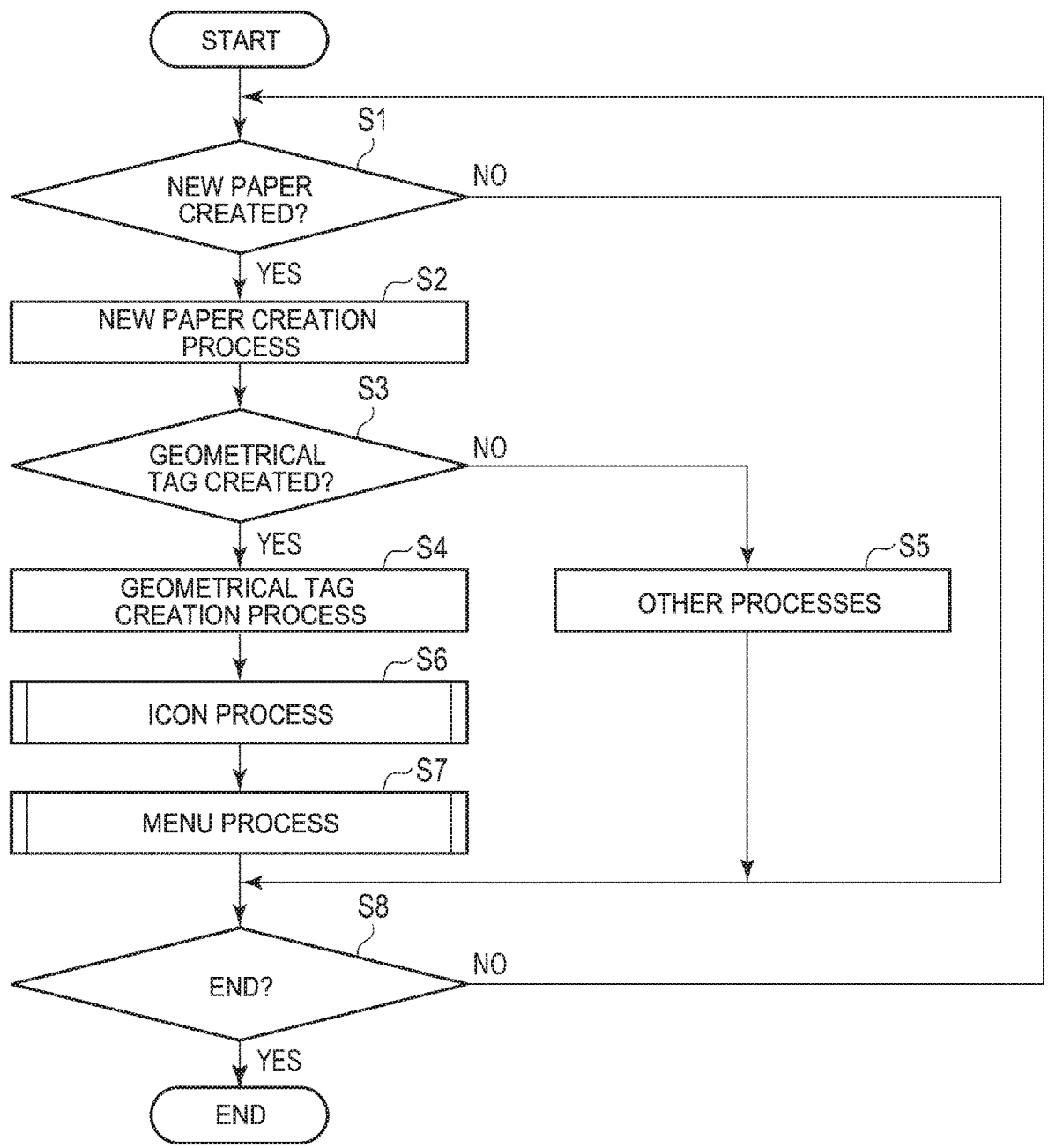
FIG. 3 is a diagram illustrating one example of a flow of mathematical processing in a case where a Web application is executed in the system.

FIG. 3 is a diagram illustrating one example of the flow of the mathematical processing in a case where the Web application is executed in the system 1. The processing in FIG. 3 is executed after launch of the Web application is requested from the terminal 20 to the server 10. Incidentally, in a case of requesting launch of the Web application, a login process such as inputting of an ID and a password and so forth may be executed. In response to the request for launch of the Web application, the server 10 sends a program of the Web application which includes data on an initial screen to the terminal 20. The terminal 20 receives the program and displays the initial screen on the Web browser. On the initial screen, the paper 100 is not yet created and only the new paper creation icon 100c is displayed on the upper-stage area 100a. Incidentally, the mathematical processing in FIG. 3 is executed by cooperation of the CPU 21 of the terminal 20 with the processor 11 of the server 10.

In step S1, the CPU 21 of the terminal 20 decides whether the new paper is to be created. For example, in a case where the new paper creation icon 100c is selected by the user on the initial screen, the CPU 121 of the terminal 20 decides whether the new paper is to be created. In step S1, in a case where it is not decided to create the new paper, the process shifts to step S8. In step S1, in a case where it is decided to create the new paper, the process shifts to step S2.

In step S2, the CPU 21 newly creates the paper 100. Then, the CPU 21 displays the created paper 100 on the Web browser in a state of being superposed on the display screen of the Web application. Thereby, display on the Web browser in the terminal 20 is updated to a state where the newly created paper 100 is displayed. Then, the process shifts to step S3. Here, not illustrated coordinate axes are set on the paper 100. Accordingly, each object which is disposed on the paper 100 has coordinate information. The CPU 21 acquires the coordinate information of each object as necessary.

In step S3, the CPU 21 decides whether the geometrical tag 1012 is to be created. For example, in a case where an operation for creating the geometrical tag 101 is performed by the user in a state where creation of the paper 100 is completed, the CPU 21 decides to create the geometrical tag 101. Incidentally, in the operation for creating the geometrical tag 101, for example, a cursor (not illustrated) is moved to a desired position in the paper 100 and then a geometrical tag creation item is selected from within items in a menu which is displayed in accordance with an operation of clicking a right button of a mouse. In step S3, in a case where it is not decided to create the geometrical tag 101, the process shifts to step S5. In step S3, in a case where it is decided to create the geometrical tag 101, the process shifts to step S4.

In step S4, the CPU 21 executes a geometrical tag creation process. For example, the CPU 21 displays a new geometrical tag 101 on the Web browser in a state of being superposed on a predetermined position of the paper 100 which is displayed on the display screen of the Web application. Thereby, the display on the Web browser in the terminal 20 is updated to a state where the geometrical tag 101 is displayed in the paper 100. Then, the process shifts to step S6. As described above, the geometrical tag 101 may be the floating object. In this case, the CPU 21 may change the display position of the geometrical tag 101, responding to execution of an operation of moving the geometrical tag 101 such as a drag operation (an operation of moving the cursor while clicking on the button of the mouse or an operation of moving a touch position while touching a screen of a touch panel) and so forth.

In step S5, the CPU 21 executes processes other than the geometrical tag creation process. The other processes include a numerical formula tag creation process, a graph tag creation process and so forth. Detailed description of the other processes is omitted. After termination of execution of the other processes, the process shifts to step S8.

In step S6, the CPU 21 executes an icon process. After execution of the icon process, the process shifts to step S7. The icon process is a process of executing various processes which are associated with selection of the icon concerned on the menu icon bar 130. Details of the icon process will be described later.

In step S7, the CPU 21 executes a menu process. After execution of the menu process, the process shifts to step S8. The menu process is a process of executing various processes which are associated with selection of the item concerned in the menu. Details of the menu process will be described later.

In step S8, the CPU 21 decides whether execution of the processing of the Web application is to be terminated. For example, in a case where an operation of closing the Web browser is performed, the CPU 21 decides to terminate execution of the processing of the Web application. In step S8, in a case where it is not decided to terminate execution of the processing of the Web application, the process returns to step S1. In step S8, in a case where it is decided to terminate execution of the mathematical processing of the Web application, the CPU 21 instructs to terminate execution of the mathematical processing in FIG. 3.

Figure 4:
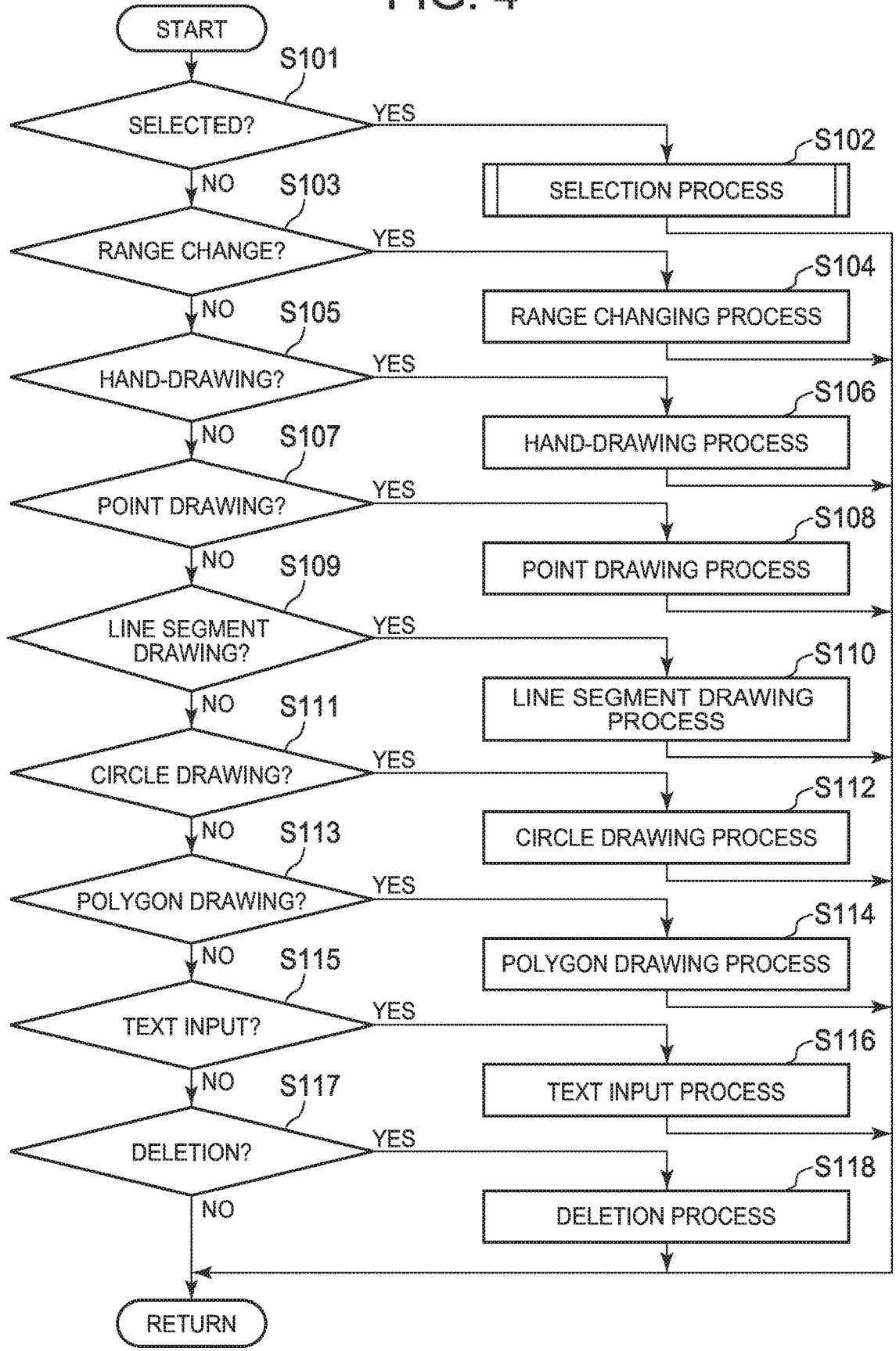
FIG. 4 is a diagram illustrating one example of a flow of an icon process.

FIG. 4 is a diagram illustrating one example of a flow of the icon process. In step S101, the CPU 21 of the terminal 20 decides whether a selection process is to be executed. In a case where the selection icon 131 which is included in the menu icon bar 130 is selected, the CPU 21 decides to execute the selection process. In step S101, in a case where it is decided to execute the selection process, the process shifts to step S102. In step S101, in a case where it is not decided to execute the selection process, the process shifts to step S103.

In step S102, the CPU 21 executes the selection process. After execution of the selection process, the CPU 21 instructs to terminate execution of the icon process in FIG. 4 and to shift the process to step S7 in FIG. 3. The selection process is a process of selecting the object concerned in the paper 100 by the user operation. Details of the selection process will be described later.

In step S103, the CPU 21 decides whether a range change process is to be executed. In a case where the range change icon 132 which is included in the menu icon bar 130 is selected, the CPU 21 decides to execute the range change process. In step S103, in a case where it is decided to execute the range change process, the process shifts to step S104. In step S103, in a case where it is not decided to execute the range change process, the process shifts to step S105.

In step S104, the CPU 21 executes the range change process. As the range change process, the CPU 21 instructs to change a display range of the geometrical tag 101 in accordance with the drag operation by the user in the geometrical tag 101. In this operation, the CPU 21 instructs to move a display position of each tag which is being displayed in the geometrical tag 101 in accordance with the drag operation by the user. After completion of execution of the drag operation by the user, the CPU 21 instructs to terminate execution of the icon process in FIG. 4 and to shift the process proceeds to step S7 in FIG. 3.

In step S105, the CPU 21 decides whether a hand-drawing process is to be executed. In a case where the hand-drawing icon 133 is selected, the CPU 21 decides to execute the hand-drawing process. In step S105, in a case where it is decided to execute the hand-drawing process, the process shifts to step S106. In step S105, in a case where it is not decided to execute the hand-drawing process, the process shifts to step S107.

In step S106, the CPU 21 executes the hand-drawing process. As the hand-drawing process, the CPU 21 draws the figure in accordance with the user operation. The CPU 21 draws the point concerned in accordance with, for example, a pointing operation (a single-clicking operation of the mouse or an operation of tapping the screen of the touch panel) by the user in the geometrical tag 101. In addition, the CPU 21 draws the line concerned in accordance with, for example, a drag-and-drop operation (to click off the mouse button or to stop tapping the screen of the touch panel while a drag operation is being performed) which is performed by the user in the geometrical tag 101. After termination of the user operation, the CPU 21 instructs to terminate execution of the process in FIG. 4 and to shift the process to step S7 in FIG. 3.

In step S107, the CPU 21 decides whether a point drawing process is to be executed. In a case where the point drawing icon 134 is selected, the CPU 21 decides to execute the point drawing process. In step S107, in a case where it is decided to execute the point drawing process, the process shifts to step S108. In step S107, in a case where it is not decided to execute the point drawing process, the process shifts to step S109.

In step S108, the CPU 21 executes the point drawing process. As the point drawing process, the CPU 21 draws the point in accordance with the user operation. For example, the CPU instructs to move the cursor (not illustrated) to a desirable position in the geometrical tag 101 and then draws the point in accordance with the pointing operation by the user in the geometrical tag 101. In addition, the CPU 21 instructs to display a label near the drawn point. The label indicates the name of each drawn point by assigning, for example, an alphabet such as A, B, C or the like to each drawn point. Then, the CPU 21 instructs to terminate execution of the icon process in FIG. 4 and to shift the process to step S7 in FIG. 3.

In step S109, the CPU 21 decides whether a line segment drawing process is to be executed. In a case where the line segment drawing icon 135 is selected, the CPU 21 decides to execute the line segment drawing process. In step S109, in a case where it is decided to execute the line segment drawing process, the process shifts to step S110. In step 109, in a case where it is not decided to execute the line segment drawing process, the process shifts to step S111.

In step S110, the CPU 21 executes the line segment drawing process. As the line segment drawing process, the CPU 21 waits for selection of two points (the two pointing operations) which is performed by the user in the geometrical tag 101. In response to selection of the two points, the CPU 21 draws the line segment which connects together the selected two points. Incidentally, a line which is selected by the user from within a solid line, a dotted line and so forth may be adopted as the type of the line segment. Further, a straight line which passes through the two points which are selected by the user may be drawn in place of the line segment. Then, the CPU 21 instructs to terminate execution of the icon process in FIG. 4 and to shift the process to step S7 in FIG. 3. In the line segment drawing process, an equation which indicates the line segment, a length of the line segment and so forth may be arithmetically calculated from coordinates of the selected two points. Arithmetic calculations of the equation, the length and so forth of the line segment may be performed by the server 10.

In step S111, the CPU 21 decides whether a circle drawing process is to be executed. In a case where the circle drawing icon 136 is selected, the CPU 21 decides to execute the circle drawing process. In step S111, in a case where it is decided to execute the circle drawing process, the process shifts to step S112. In step S111, in a case where it is not decided to execute the circle drawing process, the process shifts to step S113.

In step S112, the CPU 21 executes the circle drawing process. As the circle drawing process, the CPU 21 waits for selection of two points (the two pointing operations) which is performed by the user in the geometrical tag 101. The CPU 21 draws a circle that the firstly selected one point is set as the center and then a distance between the next selected one point and the firstly selected one point is set as a radius. Incidentally, in a case where only one point is selected, a circle that the selected one point is set as the center and the radius is set to a default value may be drawn. In this case, the radius may be set in advance by the user. In addition, the circle drawing process may be also configured such that the drawn circle is scaled up or down by the drag-and-drop operation. That is, also, a circle that a position where an operation of clicking on the mouse button or an operation of touching on the screen of the touch panel which is included in the drag-and-drop operation is performed is set as the center and a distance measured from the center to a position where an operation of clicking off the mouse button or an operation of touching off the screen of the touch panel is performed is set as the radius may be drawn. Then, the CPU 21 instructs to terminate execution of the icon process in FIG. 4 and to shift the process to step S7 in FIG. 3. In the circle drawing process, an equation which indicates the circle which is drawn on the basis of the coordinates of the center of the circle and the radius of the circle may be arithmetically calculated. An arithmetic calculation of the equation may be performed by the server 10.

In step S113, the CPU 21 decides whether a polygon drawing process is to be executed. In a case where the polygon drawing icon 137 is selected, the CPU 21 decides to execute the polygon drawing process. In step S113, in a case where it is decided to execute the polygon drawing process, the process shifts to step S114. In step 113, in a case where it is not decided to execute the polygon drawing process, the process shifts to step S115.

In step S114, the CPU 21 executes the polygon drawing process. As the polygon drawing process, the CPU 21 waits for selection of a plurality (three or more) of points which serve as vertices of the polygon in the geometrical tag 101 by the user. After selection of the three or more points, the CPU 21 waits for selection of the point which is firstly selected in the selected points. In response to selection of the firstly selected point, the CPU 21 draws the polygon that the firstly selected point is set as a starting point and then the other selected points are set as the vertices. Then, the CPU 21 instructs to terminate execution of the icon process in FIG. 4 and to shift the process to step S7 in FIG. 3. In the polygon drawing process, a length of each side, an angle between the sides concerned and so forth may be arithmetically calculated. Arithmetic calculations of the length of each side, the angle between the sides concerned and so forth may be performed by the server 10.

In step S115, the CPU 21 decides whether a text input process is to be executed. In a case where the text input icon 138 is selected, the CPU 21 decides to execute the text input process. In step S115, in a case where it is decided to execute the text input process, the process shifts to step S116. In step S115, in a case where it is not decided to execute the text input process, the process shifts to step S117.

In step S116, the CPU 21 executes the text input process. As the text input process, the CPU 21 instructs to display, for example, a text box in the geometrical tag 101 and waits for inputting of the text into the text box by the user. Inputting of the text may be performed by using the keyboard of the input device 25 and/or may be performed on a software keyboard. Then, the CPU 21 instructs to terminate execution of the icon process in FIG. 4 and to shift the process to step S7 in FIG. 3. The text box may be the floating object. That is, a display position of the text box may be made changeable in the geometrical tag 101. In addition, the text box may be created as a tag. In this case, a memo tag which is the created text box and the geometrical tag 101 may be connected together with a string.

In step S117, the CPU 21 decides whether a deletion process is to be executed. In a case where the deletion icon 139 is selected, the CPU 21 decides to execute the deletion process. In step S117, in a case where it is decided to execute the deletion process, the process proceeds to step S118. In step S117, in a case where it is not decided to execute the deletion process, the CPU 21 instructs to terminate execution of the icon process in FIG. 4 and to shift the process to step S7 in FIG. 3.

In step S118, the CPU 21 executes the deletion process. As the deletion process, the CPU 21 waits for selection of the object (the point, the line, the face or the text) in the geometrical tag 101 by the user. After selection of the object, the CPU 21 instructs to display a dialog for confirmation of deletion of the selected object. Then, the CPU 21 deletes the selected object (the point, the line, the face or the text). Then, the CPU 21 instructs to terminate execution of the icon process in FIG. 4 and to shift the process to step S7 in FIG. 3.

Here, contents of the processes which are illustrated in FIG. 3 are merely one example. The various processes which are illustrated in FIG. 3 may be performed by performing operations which are different from the above-described operations.

Figure 5:
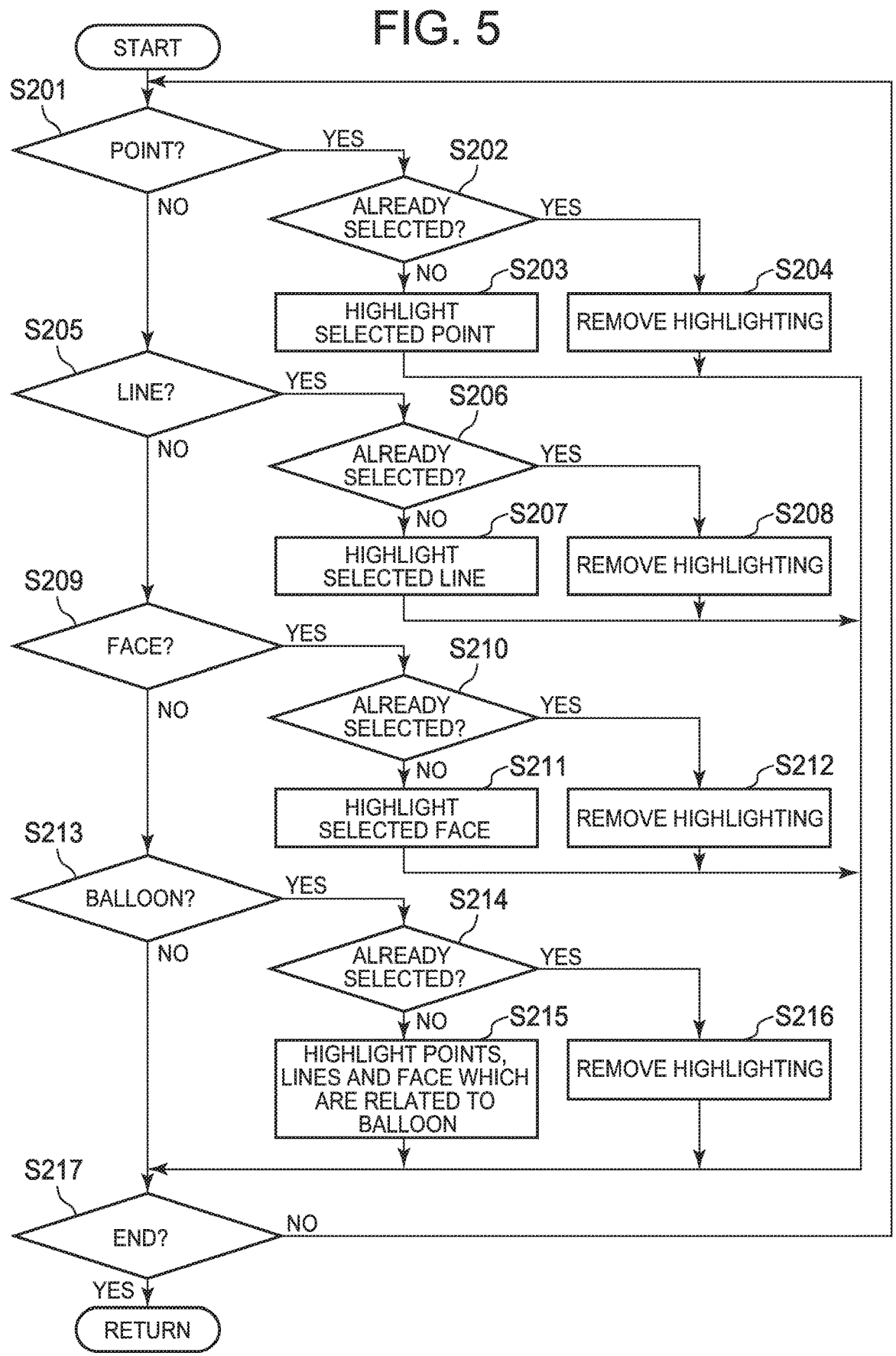
FIG. 5 is a diagram illustrating one example of a flow of a selection process.

FIG. 5 is a diagram illustrating one example of a flow of the selection process. In step S201, the CPU 21 of the terminal 20 decides whether the point concerned in the geometrical tag 101 is selected by the user. As described above, the coordinate axes are set on the paper 100 and the point which is plotted by the point drawing process and so forth has coordinate information. In a case where the coordinates of the plotted point are selected, the CPU 21 decides that the point is selected. In step S201, in a case where it is decided that the point is selected, the process shifts to step S202. In step S201, in a case where it is not decided that the point is selected, the process shifts to step S205. Incidentally, an operation of moving the cursor (not illustrated) to, for example, a position where the cursor is superposed on any of the point, the line, the face and the balloon in the geometrical tag 101 and then clicking the mouse button is an operation of selecting any of the point, the line, the face and the balloon.

In step S202, the CPU 21 decides whether the selected point is already selected. In step S202, in a case where it is not decided that the selected point is already selected, the process shifts to step S203. In step S202, in a case where it is decided that the selected point is already selected, the process shifts to step S204.

In step S203, the CPU 21 highlights the selected point and brings the selected point into a selected state. Then, the process shifts to step S217. For example, the CPU 21 makes a display size of the selected point larger than display sizes of other points. In addition to enlargement of the selected point, the CPU 21 may change the color of the selected point and may blink the selected point. Highlighting is not limited to one specific display format in this way.

In step S204, the CPU 21 removes highlighting of the selected point and releases the selected point from the selected state. Then, the process shifts to step S217.

In step S205, the CPU 21 decides whether the line segment in the geometrical tag 101 is selected by the user. In a case where any one of coordinates on the line segment which is drawn by the user is selected, the CPU 21 decides that the line segment is selected. In step S205, in a case where it is decided that the line segment is selected, the process shifts to step S206. In step S205, in a case where it is not decided that the line segment is selected, the process shifts to step S209.

In step S206, the CPU 21 decides whether the selected line segment is already selected. In step S206, in a case where it is not decided that the selected line segment is already selected, the process shifts to step S207. In step S206, in a case where it is decided that the selected line segment is already selected, the process shifts to step S208.

In step S207, the CPU 21 highlights the selected line segment and brings the selected line segment into the selected state. Then, the process shifts to step S217. For example, the CPU 21 makes the selected line segment thicker than other line segments. In addition to thickening of the line segment, the CPU 21 may change the color of the selected line segment and may blink the selected line segment. Highlighting is not limited to one specific display format in this way.

In step S208, the CPU 21 removes highlighting of the selected line segment and releases the selected line segment from the selected state. Then, the process shifts to step S217.

In step S209, the CPU 21 decides whether the face in the geometrical tag 101 is selected by the user. In a case where any one of coordinates on the face which configures the figure which is drawn by the user is selected, the CPU 21 decides that the face is selected. In step S209, in a case where it is decided that the face is selected, the process shifts to step S210. In step S209, in a case where it is not decided that the face is selected, the process shifts to step S213.

In step S210, the CPU 21 decides whether the selected face is already selected. In step S210, in a case where it is not decided that the selected face is already selected, the process shifts to step S211. In step S210, in a case where it is decided that the selected face is already selected, the process shifts to step S212.

In step S211, the CPU 21 highlights the selected face and brings the selected face into the selected state. Then, the process shifts to step S217. For example, the CPU 21 makes a color of the selected face deeper than colors of other parts. Highlighting is not limited to one specific display format. Incidentally, in a case of selecting the face, only the face which configures the figure is selected and the sides and vertices which also configure the figure are not selected.

In step S212, the CPU 21 removes highlighting of the selected face and releases the selected face from the selected state. Then, the process shifts to step S217.

In step S213, the CPU 21 decides whether the balloon 101a in the geometrical tag 101 is selected by the user. In a case where coordinates of a position where the balloon 101a is displayed are selected, the CPU 21 decides that the balloon 101a is selected. In step S213, in a case where it is decided that the balloon 101a is selected, the process shifts to step S214. In step S213, in a case where it is not decided that the balloon 101a is selected, the process shifts to step S217.

In step S214, the CPU 21 decides whether at least any one of the points, the lines and the face which are the constitutional elements of the figure which is related to the selected balloon 101a is already selected. In step S214, in a case where it is not decided that at least any one of the points, the lines and the face which are the constitutional elements of the figure which is related to the selected balloon 101a is already selected, the process shifts to step S215. In step S214, in a case where it is decided that at least any one of the points, the lines and the face which are the constitutional elements of the figure which is related to the selected balloon 101a is already selected, the process shifts to step S216.

In step S215, the CPU 21 highlights the points, the lines and the face which are the constitutional elements of the figure which is related to the selected balloon 101a and brings the points, the lines and the face into the selected states. Then, the process shifts to step S217. A highlighting method may be either a combination of methods which are described in step S203, step S207 and step S211 or a method other than the above-described methods.

In step S216, the CPU 21 removes highlighting from the points, the lines and the face which are the constitutional elements of the figure which is related to the balloon 101*a* and releases the points, the lines and the face from the selected states. Then, the process shifts to step S217.

In step S217, the CPU decides whether execution of the selection process is to be terminated. For example, in a case where another icon on the menu icon bar 130 is selected by the user and/or an operation of closing the Web application is performed by the user, the CPU 21 decides to terminate execution of the selection process. In step S217, in a case where it is not decided to terminate execution of the selection process, the process returns to the step S201. In step S217, in a case where it is decided to terminate execution of the selection process, the CPU 21 instructs to shift the process to step S103 in FIG. 4.

In the following, one specific example of the selection process will be described with reference to FIG. 6A to FIG. 6D. An equilateral triangle ABC is drawn in the geometrical tag 101 in each of FIG. 6A, FIG. 6B, FIG. 6C and FIG. 6D by a regular polygon drawing process which will be described later. In addition, a point F is plotted in the geometrical tag 101 by the point drawing process in each of FIG. 6A, FIG. 6B, FIG. 6C and FIG. 6D. Here, although details will be described later, in a case where a regular polygon is drawn by the regular polygon drawing process, the balloon 101*a* is displayed in a state of being superposed on a gravity center position of the regular polygon which is drawn. The number Np of the vertices of the drawn regular polygon is displayed in the balloon 101*a*. For example, in a case where the drawn figure is the equilateral triangle, [Np=3] is displayed as the balloon 101*a*. Further, in a case where the figure is drawn by the regular polygon drawing process, the operation tag 102 is created. In a case of the regular polygon drawing process, the letter [n-polygon] 102*a* which indicates that the regular polygon drawing process is executed as the mathematical processing and the parameter value 102*b* which is set in the regular polygon drawing process are displayed on the operation tag 102.

Figure 6A:
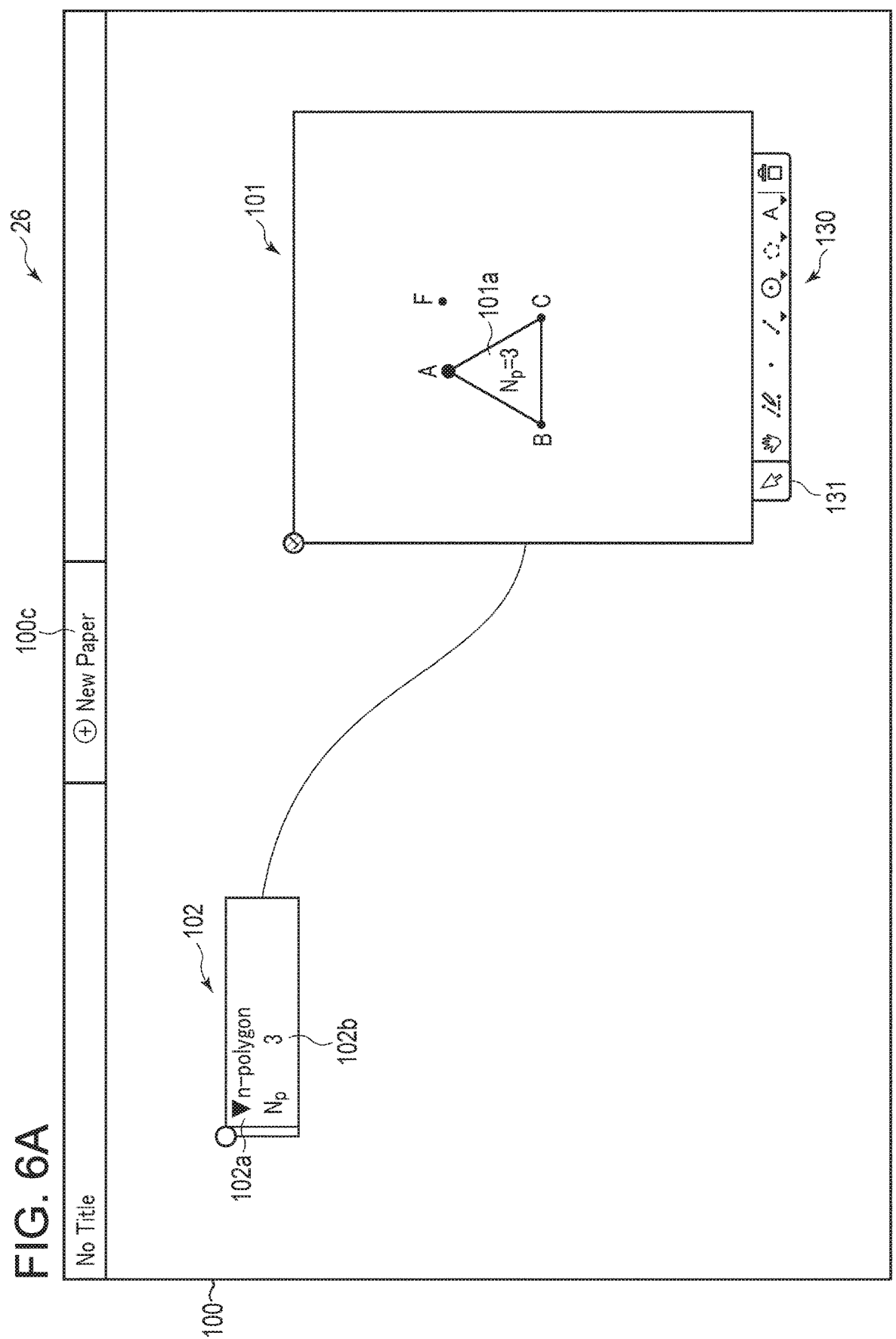
FIG. 6A is a diagram illustrating a display example of a case where a point A is selected in the selection process.

FIG. 6A illustrates a display example of a case where the point A is selected in the selection process. In this case, only the point A is highlighted and is brought into the selected state. Incidentally, although not illustrated in FIG. 6A, also in a case where the point F is selected, the point F is highlighted similarly. It is possible to utilize the selected point in a rotation process, a line symmetry process, a translation process and so forth which will be described later. For example, in a case where point selection is performed in the selection process prior to execution of a line segment drawing process, a circle drawing process and so forth, the CPU 21 may simply wait for selection of remaining points which are necessary for drawing. In addition to point selection, a process of displaying information on the selected point on the display device 26 such as a process of displaying the coordinates of the selected point on the display device 26 and so forth may be executed, and also a visualization process of making the selected point invisible or visible on the display screen of the display device 26 and so forth may be executed.

FIG. 6B illustrates a display example of a case where a line segment AB is selected in the selection process. In this case, only the line segment AB is highlighted and is brought into the selected state. It is possible to utilize the selected line segment in the rotation process, the line symmetry process, the translation process and so forth which will be described later. In addition, a process of displaying information on the selected line segment on the display device 26, such as a process of displaying an equation which expresses the selected line segment on the display device 26, a process of displaying a length of the selected line segment on the display device 26 and so forth may be executed, and a visualization process of making the selected line segment invisible or visible on the display screen of the display device 26 and so forth may be also executed.

FIG. 6C illustrates a display example of a case where the face of the equilateral triangle ABC is selected in the selection process. In this case, only the face which is surrounded by sides (line segments) AB, BC and CA is highlighted and is brought into the selected state. On the other hand, the sides AB, BC and CA are neither highlighted nor brought into the selected states. It is possible to utilize the selected face in the rotation process, the line symmetry process, the translation process and so forth which will be described later. In addition, a process of displaying information on the selected face on the display device 26 such as a process of displaying an equation which expresses the selected face on the display device 26, a process of displaying an area of the selected face on the display device 26 and so forth may be executed, and a visualization process of making the selected face invisible or visible on the display screen of the display device 26 and so forth may be executed.

Figure 6D:
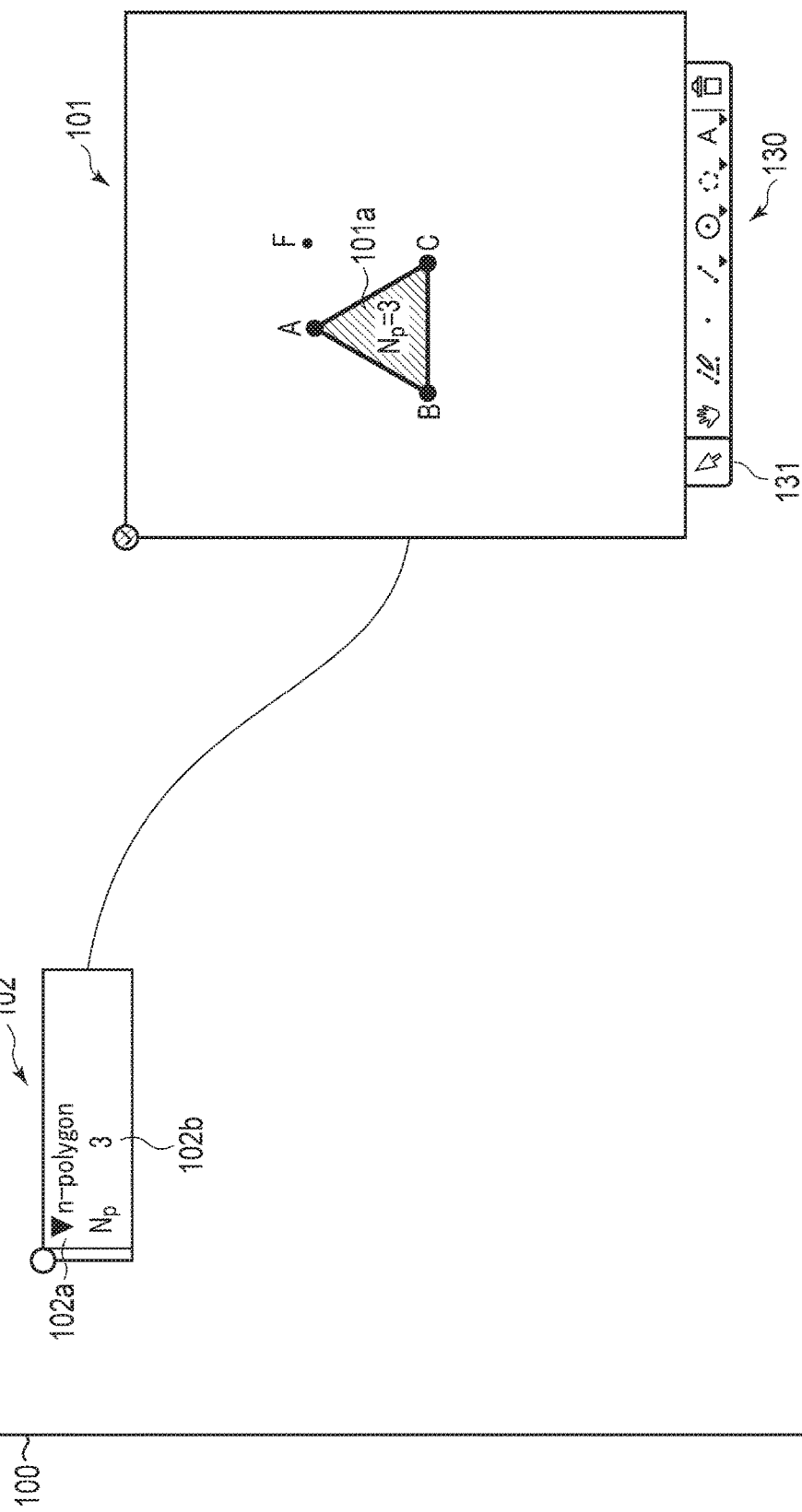
FIG. 6D is a diagram illustrating a display example of a case where a balloon is selected in the selection process.

FIG. 6D illustrates a display example of a case where the balloon 101*a* is selected in the selection process. In this case, respective elements of the equilateral triangle ABC which is related to the balloon 101*a* are selected. Specifically, the points A, B and C, the line segments AB, BC and CA and the face which is surrounded by the line segments AB, BC and CA are highlighted and are brought into the selected states. It is possible to utilize the respective selected elements in the rotation process, the line symmetry process, the translation process and so forth which will be described later. In addition, a visualization process of making the selected points, line segments and face invisible or visible on the display screen of the display device 26 may be executed.

Figure 7:
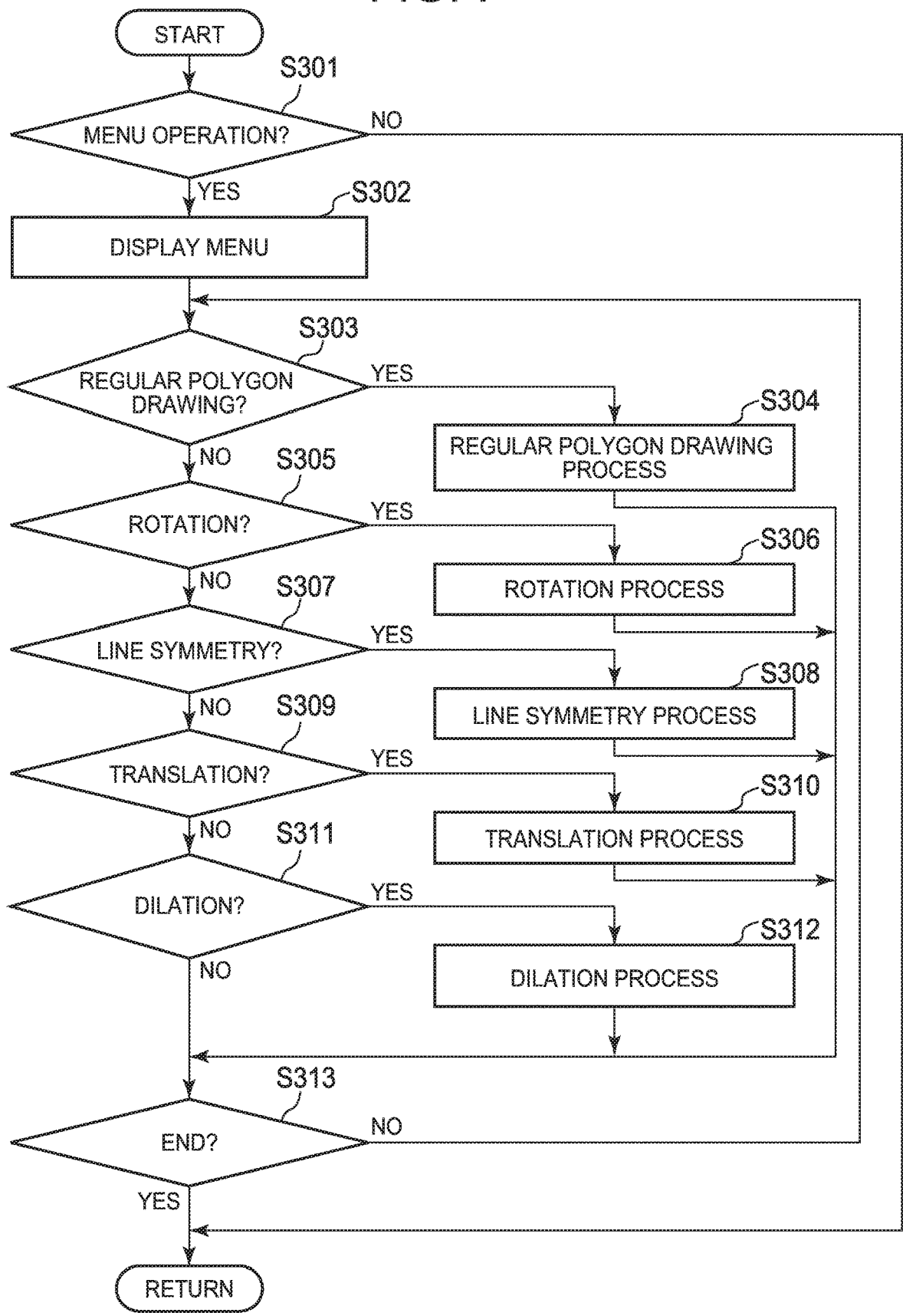
FIG. 7 is a diagram illustrating one example of a flow of a menu process.

FIG. 7 is a diagram illustrating one example of a flow of the menu process. In step S301, the CPU 21 of the terminal 20 decides whether a menu operation is performed by the user. The menu operation is, for example, an operation of clicking the right button of the mouse and an operation of holding down a button on the display screen for a bit. In step S301, in a case where it is decided that the menu operation is performed, the process shifts to step S302. In step S301, in a case where it is not decided that the menu operation is performed, the CPU 21 instructs to shift the process to step S8 in FIG. 3.

In step S302, the CPU 21 instructs to display a menu on the display screen. Then, the process shifts to step S303. A menu display position may be a position where the right button of the mouse is clicked, a position where the touch operation is performed and so forth. The menu includes items such as, for example, [Regular Polygon Drawing], [Rotation], [Line Symmetry], [Translation], [Dilation] and so forth. Some of the above-described menu items may be omitted. In addition, items other than the above items may be added as the menu items.

In step S303, the CPU 21 decides whether the regular polygon drawing process is to be executed. In a case where the item [Regular Polygon Drawing] is selected, the CPU 21 decides to execute the regular polygon drawing process. In step S303, in a case where it is decided to execute the regular polygon drawing process, the process shifts to step S304. In step S303, in a case where it is not decided to execute the regular polygon drawing process, the process shifts to step S305.

In step S304, the CPU 21 executes the regular polygon drawing process. Then, the process shifts to step S313. The regular polygon drawing process is a process of drawing the regular polygon that the line segment which is selected by the user is set as one side. Accordingly, first, the CPU 21 instructs the user to select the line segment in the geometrical tag 101. In a case where the line segment is already selected in the selection process, execution of the line segment selection process is omitted. After selection of the line segment, the CPU 21 instructs the user to input the value of the number of vertices Np. It is also possible to set the value of the number of vertices Np to a variable. In a case where the value of the number of vertices Np is the variable, the CPU 21 instructs the user to decide the value of the variable. It is possible to change the value of the variable by using the slider 103b. Then, the CPU 21 creates the regular polygon on the basis of the length of the selected line segment and the number of vertices. That is, the CPU 21 determines the number of remaining sides and the angle between the two sides. Such a regular polygon creation process may be executed by the server 10. After creation of the regular polygon, the CPU 21 draws the created regular polygon in the geometrical tag 101. In addition, the CPU 21 instructs to display the balloon 101a in a state of being superposed on the gravity center position of the created regular polygon. As described above, in a case of the regular polygon drawing process, the value of the number of vertices Np is displayed in the balloon 101a. Further, the CPU 21 creates the operation tag 102 which indicates information on the created regular polygon. Then, the CPU 21 instructs to display the created operation tag 102.

Here, the balloon 101a which indicates the information on the figure which is created by execution of the regular polygon drawing process may be the floating object. However, the balloon 101a is also the tool chip which is used to indicate that the figure which is created is the figure which is created by the regular polygon drawing process. Accordingly, it is preferable that the balloon 101a be displayed in a state of clarifying a relation between the balloon 101a and the created figure. For this reason, it is desirable to restrict a moving range of the balloon 101a so as to fall within a predetermined distance which is measured from, for example, the center of gravity of the created figure.

In step S305, the CPU 21 decides whether the rotation process is to be executed. In a case where the item [Rotation] is selected, the CPU 21 decides to execute the rotation process. In step S305, in a case where it is decided to execute the rotation process, the process shifts to step S306. In step S305, in a case where it is not decided to execute the rotation process, the process shifts to step S307.

In step S306, CPU 21 executes the rotation process. Then, the process shifts to step S313. The rotation process is a process of rotating the figure with a point which is selected by the user being set as the rotation center. Accordingly, first, the CPU 21 instructs the user to select one figure to be rotated. In a case where the figure is already selected in the selection process, execution of the selection process by the user is omitted. After selection of the figure to be rotated, the CPU 21 instructs the user to select one point which serves as the rotation center in the geometrical tag 101. After selection of the point which serves as the rotation center, the CPU 21 instructs the user to input the value of the rotation angle R. As described above, it is also possible to set the value of the rotation angle R to the variable. In a case where the value of the rotation angle R is the variable, the CPU 21 instructs the user to determine the value of the variable. It is possible to change the variable value by using the slider 103b. After determination of the figure to be rotated, the rotation center point and the rotation angle, the CPU 21 creates a figure of a form that the figure to be rotated is rotated through a rotation angle which is set by the user relative to the rotation center point. That is, the CPU 21 performs coordinate transformation that each coordinate of the figure which is selected to be rotated is rotated through a selected rotation angle. This process of creating the rotated figure may be executed by the server 10. After creation of the rotated figure, the CPU 21 draws the rotated figure which is created in the geometrical tag 101. In addition, the CPU 21 instructs to display the balloon 101a in a state of being superposed on the rotation center position. As mentioned above, in a case of the rotation process, the value of the rotation angle R is displayed in the balloon 101a. Further, the CPU 21 creates the operation tag 102 which indicates information on the rotated figure which is created. In addition, in a case where the variable is input as the rotation angle, the CPU 21 creates the slider tag 103. Then, the CPU 21 instructs to display the operation tag 102 and the slider tag 103 which are created.

Here, the balloon 101a which indicates information on the figure which is created by the rotation process may be the floating object. However, it is desirable to restrict the moving range of the balloon 101a so as to fall within a predetermined distance which is measured from, for example, the rotation center for the same reason as that in the regular polygon drawing process.

In step S307, the CPU 21 decides whether the line symmetry process is to be executed. In a case where the item [Line Symmetry] is selected, the CPU 21 decides to execute the line symmetry process. In step S307, in a case where it is decided to execute the line symmetry process, the process shifts to step S308. In step S307, in a case where it is not decided to execute the line symmetry process, the process shifts to step S309.

In step S308, the CPU 21 executes the line symmetry process. Then, the process shifts to step S313. The line symmetry process is a process of creating a figure which is symmetric to a line segment which is selected by the user from a figure which is selected by the user. Accordingly, first, the CPU 21 instructs the user to select the figure which becomes the basis of a line-symmetric figure. In a case where the figure is already selected in the selection process, execution of the basic figure selection process is omitted. After selection of the figure which becomes the basis, the CPU 21 instructs the user to select one of the line segments in the geometrical tag 101. After selection of the line segment, the CPU 21 creates the figure which is symmetric to the line segment. This line-symmetric figure creation process may be executed by the server 10. After creation of the line-symmetric figure, the CPU 21 draws the created line-symmetric figure in the geometrical tag 101. In a case of the line symmetry process, the balloon 101a and the operation tag 102 may not be created. As an alternative, the balloon 101a which includes the letter 102a which is written as [Reflection] which indicates execution of the line symmetry process may be displayed in the vicinity of the selected line segment and the operation tag 102 which includes the same information may be created. In this case, the moving range of the balloon 101a may be restricted to the vicinity of the selected line segment.

In step S309, the CPU 21 decides whether the translation process is to be executed. In a case where the item [Translation] is selected, the CPU 21 decides to execute the translation process. In step S309, in a case where it is decided to execute the translation process, the process shifts to step S310. In step S309, in a case where it is not decided to execute the translation process, the process shifts to step S311.

In step S310, the CPU 21 executes the translation process. Then, the process shifts to step S313. The translation process is a process of translating a figure which is selected by the user. For this purpose, first, the CPU 21 instructs the user to select the figure to be translated. In a case where the figure is already selected in the selection process, execution of this figure selection process is omitted. After selection of the figure to be translated, the CPU 21 instructs the user to input values (an X direction and a Y direction) of a translation amount T. It is also possible to set the values of the translation amount T to variables. In a case where the values of the translation amount T are the variables, the CPU 21 instructs the user to determine values of the variables. It is possible to change the values of the variable by using the slider 103b. After determination of the figure to be translated and the translation amount T, the CPU 21 creates a figure which is obtained by translating the figure to be translated by the translation amount T. That is, the CPU 21 performs coordinate transformation that the translation amount T is added to each coordinate of the figure which is selected to be translated. This process of creating the translated figure may be also executed by the server 10. After creation of the translated figure, the CPU 21 draws the translated figure which is created in the geometrical tag 101. In addition, the CPU 21 instructs to display the balloon 101a in a superposed state. In a case of the translation process, the balloon 101a is displayed, for example, on the corner of the geometrical tag 101. The moving range of the balloon 101a may be either restricted or not restricted.

In step S311, the CPU 21 decides whether the dilation process is to be executed. In a case where the item [Dilation] is selected, the CPU 21 decides to execute the dilation process. In step S311, in a case where it is decided to execute the dilation process, the process shifts to step S312. In step S311, in a case where it is not decided to execute the dilation process, the process shifts to step S313.

In step S312, the CPU 21 executes the dilation process. Then, the process shifts to step S313. The dilation process is a process of creating a figure which is similar to the figure which is selected by the user on the basis of a reference point which is selected by the user. Accordingly, first, the CPU 21 instructs the user to select one figure which serves as the basis of the figure to be dilated. In a case where the figure is already selected in the selection process, execution of this basic figure selection process is omitted. After selection of the basic figure, the CPU 21 instructs the user to select one point which serves a reference of dilation in the geometrical tag 101. After selection of the reference point, the CPU 21 instructs the user to input a value of a scale factor D. It is also possible to set the value of the scale factor D to a variable. In a case where the value of the scale factor D is the variable, the CPU 21 instructs the user to determine a value of the variable. It is possible to change the variable value by using the slider 103b. After determination of the figure to be dilated, the reference point and the scale factor D, the CPU 21 creates a figure which is obtained by dilating the figure to be dilated by the set scale factor D on an extension line of the reference point and each coordinate of the figure to be dilated. This process of creating the dilated figure may be also executed by the server 10. After creation of the dilated figure, the CPU 21 draws the dilated figure which is created in the geometrical tag 101. In addition, the CPU 21 instructs to display the balloon 101a in a state of being superposed on the position of the reference point. In a case of the dilation process, the value of the scale factor D is displayed in the balloon 101a. Further, the CPU 21 creates the operation tag 102 which indicates information on the dilated figure which is created. In addition, in a case where the variable is input as the scale factor D, the CPU 21 creates the slider tag 103. Then, the CPU 21 instructs to display the operation tag 102 and the slider tag 103 which are created.

In step S313, the CPU 21 decides whether execution of the menu process is to be terminated. For example, in a case where an operation of terminating menu display is performed by the user, the CPU 21 decides to terminate execution of the menu process. In step S313, in a case where it is not decided to terminate execution of the menu process, the process returns to step S303. In step S313, in a case where it is decided to terminate execution of the menu process, the CPU 21 instructs to shift the process to step S8 in FIG. 3.

Figure 8:
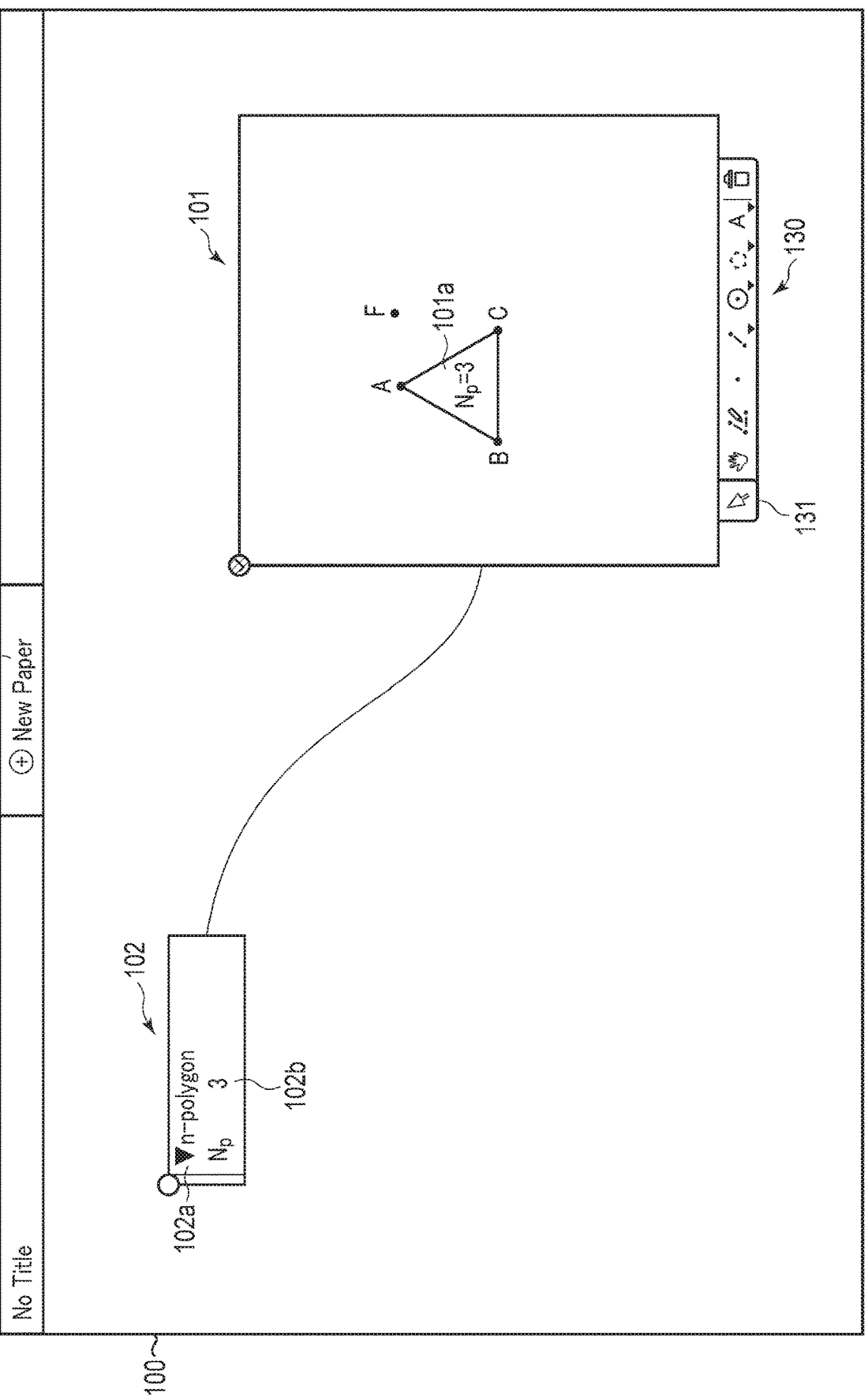
FIG. 8 is a diagram illustrating one example of a display screen which is displayed as a result of execution of a regular polygon drawing process.

FIG. 8 illustrates one example of a display screen which is displayed as a result of execution of the regular polygon drawing process. FIG. 8 illustrates one example of the display screen which is obtained, for example, in a case where the equilateral triangle that the line segment BC configures one side is created. In this case, as the balloon 101a, [Np=3] which indicates the number of vertices is displayed on the gravity center position of the triangle ABC. In addition, the letter 102a which is written as [n-polygon] which indicates that the regular polygon drawing process is executed as the mathematical processing and the parameter value 102b which is set in execution of the regular polygon drawing process are displayed in the operation tag 102.

As described above, the balloon 101a is the tool chip which is used to indicate that the triangle ABC is created by executing the regular polygon drawing process on the basis of the line segment BC. Accordingly, it is preferable that the balloon 101a be displayed in a state of clarifying a relation between the balloon 101a and the triangle ABC. Accordingly, it is desirable that the moving range of the balloon 101a be restricted so as to fall within a predetermined distance which is measured from, for example, the gravity center of the triangle ABC.

Figure 9:
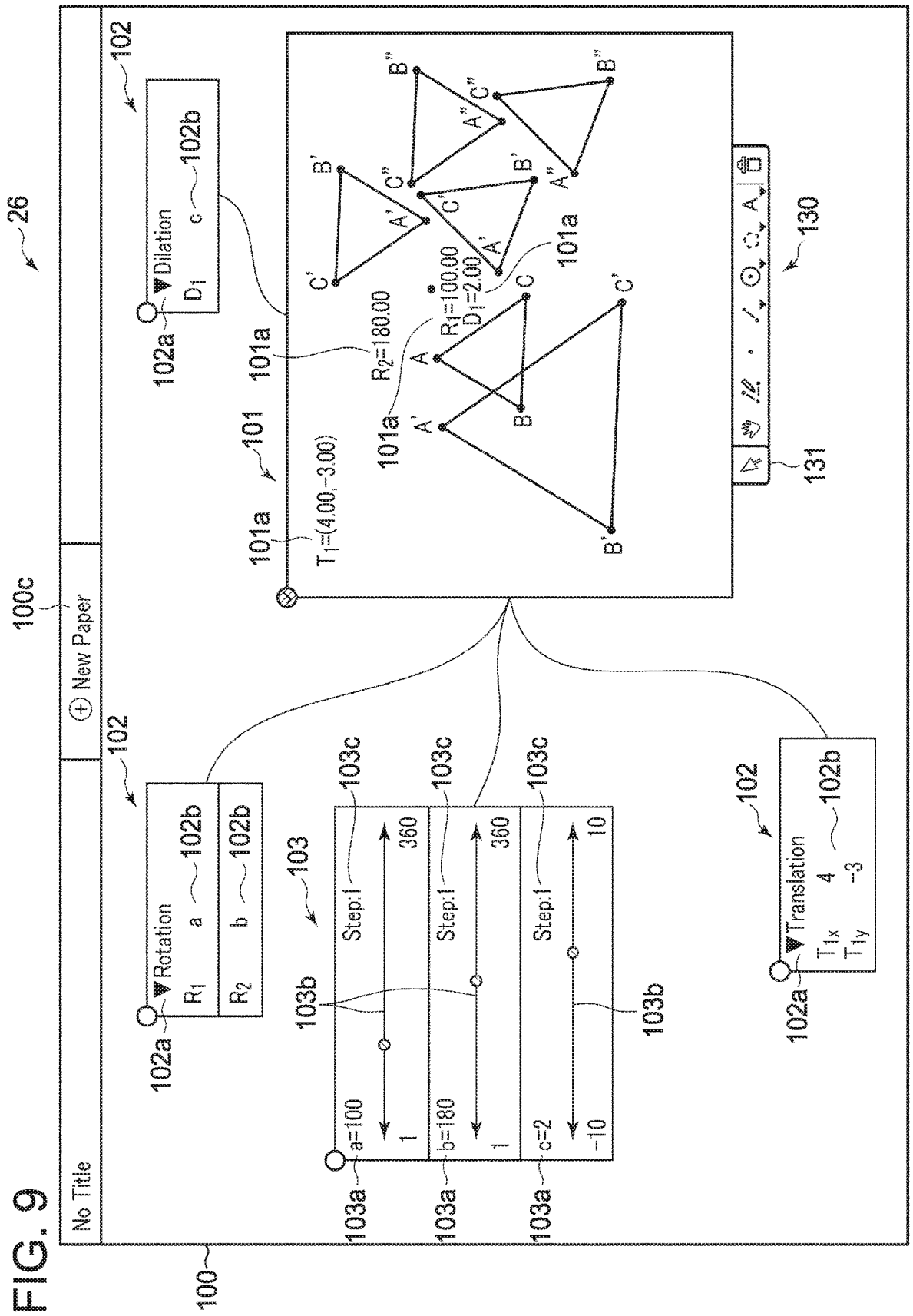
FIG. 9 is a diagram illustrating one example of a display screen which is displayed as a result of execution of a dilation process, a translation process and a rotation process.

FIG. 9 illustrates one example of the display screen which is displayed as a result of execution of the dilation process, the translation process and the rotation process. In the example in FIG. 9, the dilation process and the rotation process are executed on the triangle ABC which is created by the regular polygon drawing process. Further, two triangles C'A'B' which are created by execution of the rotation process are simultaneously selected and thereby the translation process is executed.

In FIG. 9, the reference point of the dilation process is the point F and the scale factor is a variable c. The variable c is set to 2.00 in the slider tag 103. In this case, the triangle A'B'C' which is displayed as the dilated figure is created as the figure which is four times as wide as the triangle ABC in area on the extension line (for example, at a position where each coordinate of the triangle ABC is set as a bisected point) of the reference point F and the triangle ABC. Then, the balloon 101a which indicates [$D_1$=2.00] is displayed in the vicinity of the point F which is the reference point of dilation. Further, the operation tag 102 which includes the letter 102a, that is, {Dilation} which indicates execution of the dilation process and the parameter value 102b which is set in the dilation process is displayed. Still further, since the parameter is the variable c, the slider 103*b* which is used to set the value of the variable c is displayed in the slider tag 103.

In addition, in FIG. 9, the reference point of the rotation process is the point F and two variables a and b are set for the rotation angle. In the slider tag 103, the variable a is set to 100.00 and the variable b is set to 180.00. In this case, one triangle C'A'B' which is displayed as one rotated figure is created as a figure which is obtained by rotating the triangle ABC through 100 degrees about the rotation center point F. Then, the balloon 101*a* which indicates [$R_1$=100.00] is displayed in the vicinity of the point F which is the rotation center point. Further, the operation tag 102 which includes the letter 102*a* which is written as {Rotation} which indicates execution of the rotation process and the value 102*b* of the parameter $R_1$ which is set in the rotation process is displayed. Still further, since the parameter is the variable a, the slider 103*b* which is used to set the value of the variable a is displayed in the slider tag 103. In addition, the other triangle C'A'B' which is displayed as the other rotated figure is created as a figure which is obtained by rotating the triangle ABC through 180 degrees about the rotation center point F. Then, the balloon 101*a* which indicates [$R_2$=180.00] is displayed in the vicinity of the point F which is the rotation center point. Further, the operation tag 102 which includes the letter 102*a*, that is, {Rotation} which indicates execution of the rotation process and the value 102*b* of the parameter $R_2$ which is set in the rotation process is displayed. Still further, since the parameter is the variable b, the slider 103*b* which is used to set the value of the variable b is displayed in the slider tag 103.

In addition, in FIG. 9, x=4 and y=−3 are set as values of a translation amount $T_1$. In this case, triangles C"A"B" which are displayed as translated figures are created as figures which are obtained by translating the two triangles C'A'B' by 4 in the x direction and −3 in the y direction respectively. Then, the balloon 101*a* which indicates [$T_1$=(4.00, −3.00)] is displayed, for example, on the top-left corner of the geometrical tag 101. Further, the operation tag 102 which includes the letter 102*a* which is written as [Translation] which indicates execution of the translation process and the parameter values 102*b* which are set in the translation process is displayed. In a case where the balloon 101*a* which indicates [$T_1$=(4.00, −3.00)] is selected, the two triangles C"A"B" are brought into the selected states simultaneously.

As described above, according to one embodiment, in a case where the mathematical processing is executed on the certain figure which is displayed in the geometrical tag 101, the balloon 101*a* which indicates a mathematical relation between the basic figure which is used in drawing and the figure (which is derived from the basic figure) on a drawing destination is displayed in the geometrical tag 101. It becomes possible to grasp with ease the mathematical relation between the figure which is used for drawing and the figure on the drawing destination by seeing the balloon 101*a*. In particular, as illustrated in FIG. 9, in a case where many figures are created in one geometrical tag, display of the balloon 101*a* is effective.

In addition, in a case where the balloon 101*a* is selected by the user, the points, the lines and the face which configure the corresponding figure are brought into the selected states in one batch. It becomes possible to more increase user-friendliness by making it possible to properly use such batch selection and individual selection of the points, the lines and the face depending on the situation.

In addition, in a case where there exists the reference point used for figure drawing such as the regular polygon drawing process, the rotation process, the dilation process and so forth, since the moving range of the balloon 101*a* is restricted to the vicinity of the reference point, it becomes difficult to lose the mathematical relation between the figure which is used in drawing and the figure on the drawing destination.

Here, in one embodiment, the balloon 101*a* is displayed simply in the state of being superposed on the geometrical tag 101. As an alternative, the figurer which is related to the balloon 101*a* may be displayed in a state of being connected to the balloon 101*a* with the [string].

In addition, in one embodiment, in a case where the balloon 101*a* is selected, the points, the lines and the face which configure the corresponding figure are brought into the selected states in one batch. The operation tag 102 and the slider tag 103 which correspond to the figure may be also brought into the selected states in addition to batch selection of the points, the lines and the face of the figure. Further, in a case where the balloon 101*a* is selected, the figure which becomes the basis of drawing, the reference point, the labels and so forth may be brought into the selected states simultaneously.

Further, in one embodiment, the terminal 20 is configured to execute the figure drawing process and so forth by downloading the program for the Web application from the server 10. On the other hand, it is also possible for the terminal 20 to execute the processing of the Web application which is described in one embodiment independently by storing a program which is equivalent to the program for the Web application in the storage 24 of the terminal 20. In this case, it is not necessary for the terminal 20 to have a communication function.

Incidentally, the present invention is not limited to the above-described embodiment and it is possible to modify and alter the present invention in a variety of ways within a range not deviating from the gist of the present invention in an embodying stage of the invention. In addition, respective embodiments may be implemented by appropriately combining together to the greatest possible extent and in this case, combined effects are obtained. Further, inventions which are at various stages are included in the above-described embodiment and it is possible to extract various inventions by appropriately combining together a plurality of constitutional elements which is disclosed therein. For example, in a case where it is possible to solve existing problems and it is also possible to obtain the effect of the present invention even in a state where some constitutional elements are deleted from all the constitutional elements which are described in the embodiment, it is possible to extract the configuration from which some constitutional elements are deleted as the invention.

What is claimed is:

1. A figure display method comprising:
   displaying a first figure in a first display area which is set on a display screen of a display device;
   displaying, outside the first display area, a mathematical processing change area which accepts a change in information used for specifying mathematical processing which is to be executed on the first figure;
   creating a second figure by executing the mathematical processing which is specified on the first figure according to the change in information accepted via the mathematical processing change area, and displaying the created second figure in the first display area; and displaying, in the first display area, a mathematical processing display area which displays information on the mathematical processing which is executed on the first figure, wherein the information displayed in the mathematical processing display area is indicative of a conversion relationship between the first figure and the second figure, wherein the mathematical processing change area includes a GUI element that is operable by a user to input the change in the information used for specifying the mathematical processing which is to be executed on the first figure to create the second figure, and wherein the second figure displayed in the first display area is dynamically updated and the information displayed in the mathematical processing display area is dynamically updated in accordance with the change in the information input by the user operating the GUI element, and wherein the method further comprises:

providing the mathematical processing display area in the first display area in a state of being related to the second figure;

receiving an operation of selecting the mathematical processing display area, and changing, in response to the operation of selecting the mathematical processing display area, a display state of a plurality of constitutional elements which configure, as a group, the second figure which is related to the selected mathematical processing display area, the display state being changed from one of a first display state and a second display state to the other of the first display state and the second display state, wherein, in the second display state, the plurality of constitutional elements are displayed so as to be visually distinguishable from the first display state, and wherein the plurality of constitutional elements are visibly displayed in both the first display state and the second display state.

2. The figure display method according to claim 1, wherein:

each of the plurality of constitutional elements which configures the second figure is any of a point, a line and a face, and the method further comprises:

receiving an operation of selecting any one of the constitutional elements which configures the second figure, and changing, in response to the operation of selecting any one of the constitutional elements which configures the second figure, a display state of any of the point, the line and the face which is selected by said operation of selecting any one of the constitutional elements of the second figure, the display state being changed from one of the first display state and the second display state to the other of the first display state and the second display state.

3. The figure display method according to claim 1, further comprising:

displaying another figure which becomes a basis in a case of executing the mathematical processing on the first figure in the first display area; and providing the mathematical processing display area in the first display area in a state of being related to the aforementioned another figure.

4. The figure display method according to claim 1, further comprising:

providing a mathematical processing input area which accepts an input of information used for specifying the mathematical processing which is executed on the first figure outside the first display area.

5. The figure display method according to claim 1, wherein:

the first figure includes a line segment, the second figure is a regular polygon in which the line segment is set as one side, and the method further comprises:

displaying the information on the mathematical processing in the mathematical processing display area in a state of being superposed on a center of gravity of the regular polygon.

6. The figure display method according to claim 1, wherein:

the second figure is obtained by rotating the first figure with a point which is displayed in the first display area being set as a center of rotation, and the method further comprises:

displaying the information on the mathematical processing in the mathematical processing display area in a state of being superposed on the rotation center point.

7. The figure display method according to claim 1, wherein:

the second figure is obtained by translating the first figure in the first display area, and the method further comprises:

displaying the information on the mathematical processing in the mathematical processing display area on a corner of the first display area.

8. The figure display method according to claim 1, wherein:

the second figure is obtained by dilating the first figure with a point which is displayed in the first display area being set as a dilation center reference point, and the method further comprises:

displaying the second figure in a state of being superposed on the reference point.

9. The figure display method according to claim 1, wherein:

the first display area includes a display frame that is displayed around a periphery thereof to delineate the first display area;

the method further comprises displaying, on the display screen, outside the first display area, a mathematical processing input area for inputting information used for specifying the mathematical processing which is to be executed on the first figure;

said creating the second figure comprises executing, on the first figure, the mathematical processing which is specified according to the information input via the mathematical processing input area and according to any changes input via the mathematical processing change area, and displaying the created second figure in the first display area, while simultaneously displaying the first figure in the first display area; and the method comprises displaying, within the first display area, the mathematical processing display area in the first display area while simultaneously displaying the first figure and the second figure in the first display area.

10. The figure display method according to claim 1, further comprising:

executing a plurality of different types of mathematical processing on the first figure to create a plurality of different second figures;

displaying, on the display screen outside the first display area, a plurality of mathematical processing input areas corresponding respectively to each of the plurality of different types of mathematical processing;

displaying, on the display screen outside the first display area, a plurality of mathematical processing change areas corresponding to the plurality of different types of mathematical processing; and displaying, within the first display area, a plurality of mathematical processing display areas corresponding to the plurality of different types mathematical processing within the first display area, while simultaneously displaying the first figure and the plurality of second figures within the first display area.

11. The figure display method according to claim 1, further comprising:

changing, in response to the operation of selecting the mathematical processing display area, a display state of a plurality of constitutional elements which configure, as a group, the first figure which is related to the selected mathematical processing display area, from one of the first display state and the second display state to the other of the first display state and the second display state, whereby both the display state of the plurality of constitutional elements which configure the first figure and the display state of the plurality of constitutional elements of the second figure are changed in response to the operation of selecting the mathematical processing display area.

12. The figure display method according to claim 1, further comprising:

changing, in response to the operation of selecting the mathematical processing display area, a display state of a plurality of constitutional elements which configure the mathematical processing change area including the GUI element.

13. A server which is configured to be communicable with a terminal, comprising:

a storage which is configured to store a figure display program for making a computer of the terminal execute:

displaying a first figure in a first display area which is set on a display screen of a display device, displaying, outside the first display area, a mathematical processing change area which accepts a change in information used for specifying mathematical processing which is to be executed on the first figure, creating a second figure by executing the mathematical processing which is specified on the first figure according to the change in information accepted via the mathematical processing change area, and displaying the created second figure in the first display area, and displaying, in the first display area, a mathematical processing display area which displays information on the mathematical processing which is executed on the first figure, wherein the information displayed in the mathematical processing display area is indicative of a conversion relationship between the first figure and the second figure, wherein the mathematical processing change area includes a GUI element that is operable by a user to input the change in the information used for specifying the mathematical processing which is to be executed on the first figure to create the second figure, and wherein the second figure displayed in the first display area is dynamically updated and the information displayed in the mathematical processing display area is dynamically updated in accordance with the change in the information input by the user operating the GUI element; and a communication device which transmits the figure display program which is stored in the storage to the terminal, wherein the figure display program makes the computer of the terminal further execute:

providing the mathematical processing display area in the first display area in a state of being related to the second figure;

receiving an operation of selecting the mathematical processing display area, and changing, in response to the operation of selecting the mathematical processing display area, a display state of a plurality of constitutional elements which configure, as a group, the second figure which is related to the selected mathematical processing display area, the display state being changed from one of a first display state and a second display state to the other of the first display state and the second display state, wherein, in the second display state, the plurality of constitutional elements are displayed so as to be visually distinguishable from the first display state, and wherein the plurality of constitutional elements are visibly displayed in both the first display state and the second display state.

14. The server according to claim 13, wherein:

each of the plurality of constitutional elements which configures the second figure is any of a point, a line and a face, and the figure display program makes the computer of the terminal further execute:

receiving an operation of selecting any one of the constitutional elements which configures the second figure, and changing, in response to the operation of selecting any one of the constitutional elements which configures the second figure, a display state of any of the point, the line and the face which is selected by said operation of selecting any one of the constitutional elements of the second figure, the display state being changed from one of the first display state and the second display state to the other of the first display state and the second display state.

15. The server according to claim 13, wherein the figure display program makes the computer of the terminal further execute:

displaying another figure which becomes a basis in a case of executing the mathematical processing on the first figure in the first display area; and providing the mathematical processing display area in the first display area in a state of being related to the aforementioned another figure.

16. The server according to claim 13, wherein the figure display program makes the computer of the terminal further execute further comprising:

changing, in response to the operation of selecting the mathematical processing display area, a display state of a plurality of constitutional elements which configure, as a group, the first figure which is related to the selected mathematical processing display area, from one of the first display state and the second display state to the other of the first display state and the second display state, whereby both the display state of the plurality of constitutional elements which configure the first figure and the display state of the plurality of constitutional elements of the second figure are changed in response to the operation of selecting the mathematical processing display area.

17. The server according to claim 13, wherein the figure display program makes the computer of the terminal further execute:
changing, in response to the operation of selecting the mathematical processing display area, a display state of a plurality of constitutional elements which configure the mathematical processing change area including the GUI element.

18. A figure display method comprising:
displaying a first figure in a first display area which is set on a display screen of a display device;
displaying, outside the first display area, a mathematical processing change area which accepts a change in information used for specifying mathematical processing which is to be executed on the first figure;
creating a second figure by executing the mathematical processing which is specified on the first figure according to the change in information accepted via the mathematical processing change area, and displaying the created second figure in the first display area; and
displaying, in the first display area, a mathematical processing display area which displays information on the mathematical processing which is executed on the first figure, wherein the information displayed in the mathematical processing display area is indicative of a conversion relationship between the first figure and the second figure,
wherein:
the mathematical processing change area includes a GUI element that is operable by a user to input the change in the information used for specifying the mathematical processing which is to be executed on the first figure to create the second figure,
the second figure displayed in the first display area is dynamically updated and the information displayed in the mathematical processing display area is dynamically updated in accordance with the change in the information input by the user operating the GUI element,
a plurality of second figures are created by executing the mathematical processing on the first figure a plurality of times using at least one of (i) different information according to changes in the information used for specifying the mathematical processing accepted via the mathematical processing change area and (ii) different types of processing, the plurality of second figures being displayed in the first display area, and
a plurality of mathematical processing display areas that respectively relate to the plurality of second figures are displayed in the first display area at positions relative to one another that correspond to positions at which the respective related plurality of second figures are displayed relative to one another.

19. A figure display method comprising:
displaying a first figure in a first display area which is set on a display screen of a display device;
displaying, outside the first display area, a mathematical processing change area which accepts a change in information used for specifying mathematical processing which is to be executed on the first figure;
creating a second figure by executing the mathematical processing which is specified on the first figure according to the change in information accepted via the mathematical processing change area, and displaying the created second figure in the first display area; and
displaying, in the first display area, a mathematical processing display area which displays information on the mathematical processing which is executed on the first figure, wherein the information displayed in the mathematical processing display area is indicative of a conversion relationship between the first figure and the second figure,
wherein:
the mathematical processing change area includes a GUI element that is operable by a user to input the change in the information used for specifying the mathematical processing which is to be executed on the first figure to create the second figure,
the second figure displayed in the first display area is dynamically updated and the information displayed in the mathematical processing display area is dynamically updated in accordance with the change in the information input by the user operating the GUI element,
a plurality of second figures are created by executing the mathematical processing on the first figure a plurality of times using at least one of (i) different information according to changes in the information used for specifying the mathematical processing accepted via the mathematical processing change area and (ii) different types of processing, the plurality of second figures being displayed in the first display area, and
wherein the plurality of second figures include (i) at least one one-time-transformation second figure that is created by executing the mathematical processing one time on the first figure and (ii) at least one two-time transformation second figure that is created by executing the mathematical processing two times on the first figure,
wherein, among the plurality of second figures, all of the second figures that are one-time transformation second figures are displayed in association with a same first label, and all of the second figures that are two-time transformation figures are displayed in association with a same second label.

20. A server which is configured to be communicable with a terminal, comprising:
a storage which is configured to store a figure display program for making a computer of the terminal execute:
displaying a first figure in a first display area which is set on a display screen of a display device,
displaying, outside the first display area, a mathematical processing change area which accepts a change in information used for specifying mathematical processing which is to be executed on the first figure,
creating a second figure by executing the mathematical processing which is specified on the first figure according to the change in information accepted via the mathematical processing change area, and displaying the created second figure in the first display area, and
displaying, in the first display area, a mathematical processing display area which displays information on the mathematical processing which is executed on the first figure, wherein the information displayed in the mathematical processing display area is indicative of a conversion relationship between the first figure and the second figure, wherein the mathematical processing change area includes a GUI element that is operable by a user to input the change in the information used for specifying the mathematical processing which is to be executed on the first figure to create the second figure, and wherein the second figure displayed in the first display area is dynamically updated and the information displayed in the mathematical processing display area is dynamically updated in accordance with the change in the information input by the user operating the GUI element; and a communication device which transmits the figure display program which is stored in the storage to the terminal;

wherein:

a plurality of second figures are created by executing the mathematical processing on the first figure a plurality of times using at least one of (i) different information according to changes in the information used for specifying the mathematical processing accepted via the mathematical processing change area and (ii) different types of processing, the plurality of second figures being displayed in the first display area, and a plurality of mathematical processing display areas that respectively relate to the plurality of second figures are displayed in the first display area at positions relative to one another that correspond to positions at which the respective related plurality of second figures are displayed relative to one another.

21. A server which is configured to be communicable with a terminal, comprising:

a storage which is configured to store a figure display program for making a computer of the terminal execute:

displaying a first figure in a first display area which is set on a display screen of a display device, displaying, outside the first display area, a mathematical processing change area which accepts a change in information used for specifying mathematical processing which is to be executed on the first figure, creating a second figure by executing the mathematical processing which is specified on the first figure according to the change in information accepted via the mathematical processing change area, and displaying the created second figure in the first display area, and displaying, in the first display area, a mathematical processing display area which displays information on the mathematical processing which is executed on the first figure, wherein the information displayed in the mathematical processing display area is indicative of a conversion relationship between the first figure and the second figure, wherein the mathematical processing change area includes a GUI element that is operable by a user to input the change in the information used for specifying the mathematical processing which is to be executed on the first figure to create the second figure, and wherein the second figure displayed in the first display area is dynamically updated and the information displayed in the mathematical processing display area is dynamically updated in accordance with the change in the information input by the user operating the GUI element; and a communication device which transmits the figure display program which is stored in the storage to the terminal;

wherein:

a plurality of second figures are created by executing the mathematical processing on the first figure a plurality of times using at least one of (i) different information according to changes in the information used for specifying the mathematical processing accepted via the mathematical processing change area and (ii) different types of processing, the plurality of second figures being displayed in the first display area, and wherein the plurality of second figures include (i) at least one one-time-transformation second figure that is created by executing the mathematical processing one time on the first figure and (ii) at least one two-time transformation second figure that is created by executing the mathematical processing two times on the first figure, wherein, among the plurality of second figures, all of the second figures that are one-time transformation second figures are displayed in association with a same first label, and all of the second figures that are two-time transformation figures are displayed in association with a same second label.

* * * * *

UNITED STATES PATENT AND TRADEMARK OFFICE
CERTIFICATE OF CORRECTION

PATENT NO. : 11,514,201 B2
APPLICATION NO. : 16/876248
DATED : November 29, 2022
INVENTOR(S) : Takayuki Inoue It is certified that error appears in the above-identified patent and that said Letters Patent is hereby corrected as shown below:

In the Claims

Column 23, Line 11 (Claim 10), after "types" insert -- of --.

Column 26, Line 34 (Claim 19), delete "one-time-transformation" and insert -- one-time transformation --.

Column 28, Line 35 (Claim 21), delete "one-time-transformation" and insert -- one-time transformation --.

Signed and Sealed this
Twenty-first Day of February, 2023

*Katherine Kelly Vidal*

Katherine Kelly Vidal
*Director of the United States Patent and Trademark Office*